US012176462B2

(12) United States Patent
Son et al.

(10) Patent No.: US 12,176,462 B2
(45) Date of Patent: Dec. 24, 2024

(54) PIXEL AND DISPLAY DEVICE INCLUDING THE SAME

(71) Applicant: Samsung Display Co., LTD., Yongin-si (KR)

(72) Inventors: Ock Soo Son, Yongin-si (KR); Dae Hyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 627 days.

(21) Appl. No.: 17/411,793

(22) Filed: Aug. 25, 2021

(65) Prior Publication Data

US 2022/0069166 A1 Mar. 3, 2022

(30) Foreign Application Priority Data

Aug. 26, 2020 (KR) .................. 10-2020-0108121

(51) Int. Cl.
*H01L 33/38* (2010.01)
*H01L 27/15* (2006.01)

(52) U.S. Cl.
CPC .......... *H01L 33/387* (2013.01); *H01L 27/156* (2013.01)

(58) Field of Classification Search
None
See application file for complete search history.

(56) References Cited

U.S. PATENT DOCUMENTS 9,126,836 B2 9/2015 Lee
2021/0202796 A1* 7/2021 Park .................... H01L 25/0753

FOREIGN PATENT DOCUMENTS

CN 202434519 U * 9/2012
KR 10-2020-0001648 1/2020

OTHER PUBLICATIONS

Machine-made English-language translation of CN-202434519-U.*

* cited by examiner

*Primary Examiner* — Robert K Carpenter
(74) *Attorney, Agent, or Firm* — KILE PARK REED & HOUTTEMAN PLLC

(57) ABSTRACT

A pixel may include first and second electrodes that are spaced apart from each other in a first direction, the first and second electrodes each extending in a second direction intersecting the first direction; and light emitting elements disposed between the first and second electrodes. The first electrode may include at least one (1-1)th electrode extending in a third direction inclined with respect to one of the first and second directions, and at least one (1-2)th electrode extending in a fourth direction intersecting the third direction. The second electrode may include at least one (2-1)th electrode extending in the third direction and at least one (2-2)th electrode extending in the fourth direction.

23 Claims, 18 Drawing Sheets

PIXEL AND DISPLAY DEVICE INCLUDING THE SAME

CROSS-REFERENCE TO RELATED APPLICATION(S)

This application claims priority to and benefit of Korean patent application 10-2020-0108121 under 35 U.S.C. § 119(a), filed in the Korean Intellectual Property Office on Aug. 26, 2020, the entire contents of which is incorporated herein by reference.

BACKGROUND

1. Technical Field

The disclosure generally relates to a pixel and a display device including the same.

2. Description of Related Art

As interest in information displays and demand for portable information media increase, research and commercialization has focused on display devices.

In the field of display technology, displays may include tablet computers, smartphone displays, computer monitors, smart watches, personal digital assistants (PDA), and the like. These devices use various forms of displays such as light emitting diodes (LED), organic light emitting diodes (OLED), active-matrix organic light emitting diodes (AMOLED), and the like. Displays are one of the leading causes of power drainage and/or circuit issues in many portable devices relying on battery life.

Such a display apparatus may include, as a driving circuit, a thin-film transistor (TFT), a capacitor, etc. The thin-film transistor may include an active layer including a channel area, a source area, and a drain area, and a gate electrode electrically insulated from the active layer by a gate insulating layer. In general, the active layer of the thin-film transistor may include amorphous silicon or polysilicon.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a pixel capable of improving light emission efficiency while minimizing a short-circuit defect between two adjacent electrodes.

Embodiments also provide a display device including the pixel.

In accordance with an aspect of the disclosure, there is provided a pixel that may include a first electrode and a second electrode that are spaced apart from each other in a first direction, the first electrode and the second electrode, each extending in a second direction intersecting the first direction; and light emitting elements disposed between the first electrode and the second electrode. The first electrode may include at least one (1-1)th electrode extending in a third direction inclined with respect to one of the first and second directions, and at least one (1-2)th electrode extending in a fourth direction intersecting the third direction. The second electrode may include at least one (2-1)th electrode extending in the third direction, and at least one (2-2)th electrode extending in the fourth direction.

The at least one (1-1)th electrode and the at least one (2-1)th electrode may correspond to each other in the first direction, and the at least one (1-2)th electrode and the at least one (2-2)th electrode may correspond to each other in the first direction.

The pixel may further include a bank surrounding the light emitting elements along a periphery of the light emitting elements in a plan view, the bank including at least one opening. The at least one opening may correspond to an emission area in which light is emitted in each of the light emitting elements.

The first electrode and the second electrode may have a same planar shape in the emission area.

The at least one (1-1)th electrode and the at least one (2-1)th electrode may have a same planar shape, and the at least one (1-2)th electrode and the at least one (2-2)th electrode may have a same planar shape.

The at least one (1-1)th electrode and the at least one (1-2)th electrode may form a mirror symmetry with respect to a boundary between the at least one (1-1)th electrode and the at least one (1-2)th electrode, and the at least one (2-1)th electrode and the at least one (2-2)th electrode may form a mirror symmetry with respect to a boundary between the at least one (2-1)th electrode and the at least one (2-2)th electrode.

A width of each of the at least one (1-1)th electrode, the at least one (1-2)th electrode, the at least one (2-1)th electrode, and the at least one (2-2)th electrode in the second direction may be smaller than a length of each of the light emitting elements.

Each of the at least one (1-1)th electrode and the at least one (2-1)th electrode may have a polygonal shape having an inclination corresponding to the third direction in a plan view and each of the at least one (1-2)th electrode and the at least one (2-2)th electrode may have a polygonal shape having an inclination corresponding to the fourth direction in a plan view.

The at least one (1-1)th electrode and the at least one (1-2)th electrode may be alternately arranged along the second direction, and the at least one (2-1)th electrode and the at least one (2-2)th electrode may be alternately arranged along the second direction.

The pixel may further include an insulating layer disposed over the light emitting elements. The insulating layer may have a planar shape corresponding to the first and second electrodes.

The pixel may further include a first contact electrode provided on the insulating layer, the first contact electrode being electrically connected to the first electrode and each of the light emitting elements; and a second contact electrode disposed to be spaced apart from the first contact electrode in the first direction, the second contact electrode being electrically connected to the second electrode and each of the light emitting elements.

The first contact electrode may have a planar shape corresponding to the first electrode, and the second contact electrode may have a planar shape corresponding to the second electrode.

A width between the first electrode and the second electrode in the first direction may be constant along the second direction in a plan view.

A width of the at least one (1-1)th electrode in the first direction and a width of the at least one (1-2)th electrode in the first direction may be equal to each other, and a width of the at least one (1-2)th electrode in the first direction and a width of the at least one (2-2)th electrode in the first direction may be equal to each other.

Each of the light emitting elements may include a first end portion and a second end portion, which are located at ends of each of the light emitting elements in a length direction between the first electrode and the second electrode. The first end portion may be located adjacent to one of the first and second electrodes, and the second end portion may be located adjacent to the other of the first and second electrodes.

The light emitting elements may include light emitting elements of which length direction is parallel to the third direction or the fourth direction.

The first electrode and the second electrode may have a zigzag shape in a plan view.

The first electrode and the second electrode may include at least one curve having a predetermined curvature in a plan view.

In accordance with an aspect of the disclosure, there is provided a display device that may include a substrate; and a plurality of pixels provided on the substrate. Each of the pixels may include a pixel circuit layer provided on the substrate, the pixel circuit layer including at least one transistor; a first electrode and a second electrode that are disposed on the pixel circuit layer and are spaced apart from each other in a first direction, the first electrode and the second electrode, each extending in a second direction intersecting the first direction; light emitting elements disposed between the first electrode and the second electrode; and an insulating layer disposed over the light emitting elements.

The first electrode may include at least one (1-1)th electrode extending in a third direction inclined with respect to one of the first and second directions, and at least one (1-2)th electrode extending in a fourth direction intersecting the third direction. The second electrode may include at least one (2-1)th electrode extending in the third direction, and at least one (2-2)th electrode extending in the fourth direction.

The at least one (1-1)th electrode and the at least one (2-1)th electrode may correspond to each other in the first direction, and the at least one (1-2)th electrode and the at least one (2-2)th electrode may correspond to each other in the first direction.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1A:
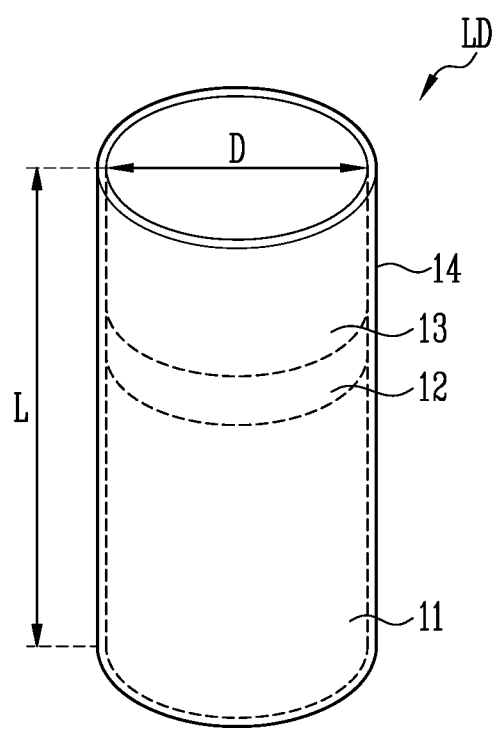
FIG. 1A is a perspective view schematically illustrating a light emitting element in accordance with an embodiment of the disclosure.

The disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element. For example, the expression "A and/or B" indicates only A, only B, or both A and B. The expression "at least one of A and B" indicates only A, only B, or both A and B.

The terms "and" and "or" may be used in the conjunctive or disjunctive sense and should generally be interpreted as "and/or". Throughout the disclosure, the expression "at least one of a, b, and c" indicates only a, only b, only c, both a and b, both a and c, both b and c, all of a, b, and c, or variations thereof.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Hereinafter, embodiments of the disclosure and items required for those skilled in the art to easily understand the content of the disclosure will be described in detail with reference to the accompanying drawings. In the following description, singular forms in the disclosure are intended to include the plural forms as well, unless the context clearly indicates otherwise.

The term "overlap" may include layer, stack, face or facing, extending over, extending under, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

Terms such as "about", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2A:
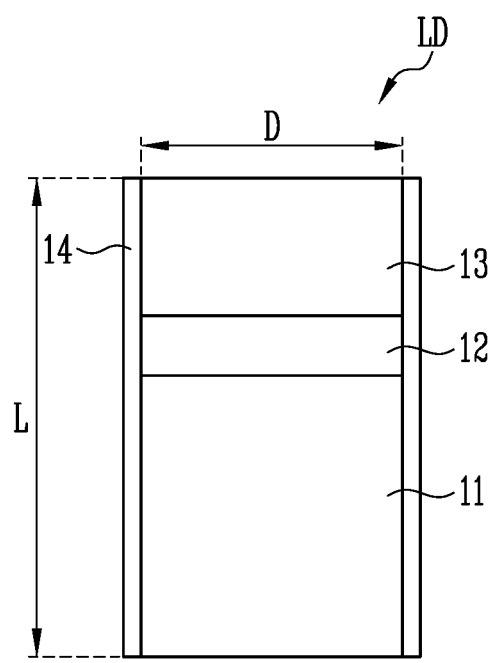
FIG. 2A is a sectional view of the light emitting element shown in FIG. 1A.

FIG. 1A is a perspective view schematically illustrating a light emitting element in accordance with an embodiment of the disclosure. FIG. 2A is a sectional view of the light emitting element shown in FIG. 1A.

In an embodiment of the disclosure, the kind and/or shape of the light emitting element is not limited to the embodiments shown in FIGS. 1A and 2A.

Referring to FIGS. 1A and 2A, a light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure in which the first semiconductor layer 11, the active layer 12, and the second semiconductor layer 13 are sequentially stacked.

The light emitting element LD may be provided in a shape extending in one direction. In the case of assuming that an extending direction of the light emitting element LD is a length direction, the light emitting element LD may include one end portion (or lower end portion) and the other end portion (or upper end portion) along the extending direction. Any one of the first and second semiconductor layers 11 and 13 may be disposed at the one end portion (or lower end portion) of the light emitting element LD, and the other of the first and second semiconductor layers 11 and 13 may be disposed at the other end portion (or upper end portion) of the light emitting element LD. In an example, the first semiconductor layer 11 may be disposed at the one end portion (or lower end portion) of the light emitting element LD, and the second semiconductor layer 13 may be disposed at the other end portion (or upper end portion) of the light emitting element LD.

The light emitting element LD may be provided in various shapes. In an example, the light emitting element LD may have a rod-like shape or bar-like shape, which is long in its length L direction (i.e., its aspect ratio is greater than 1). In an embodiment of the disclosure, a length L of the light emitting element LD in the length direction may be larger than a diameter D (or a width of a cross-section) of the light emitting device LD. The light emitting element LD may include, for example, a light emitting diode (LED) manufactured small enough to have a diameter D and/or a length L to a degree of nano scale to micro scale.

The diameter D of the light emitting element LD may be about 0.5 μm to 500 μm, and the length L of the light emitting element LD may be about 1 μm to 10 μm. However, the diameter D and the length L of the light emitting element LD are not limited thereto, and the size of the light emitting element LD may be modified to be suitable for requirements (or design conditions) of a lighting device or a self-luminescent display device, to which the light emitting element LD is applied.

The first semiconductor layer 11 may include, for example, at least one n-type semiconductor layer. For example, the first semiconductor layer 11 may include any one semiconductor material among InAlGaN, GaN, AlGaN, InGaN, AlN, and InN, and include an n-type semiconductor layer doped with a first conductive dopant (or n-type dopant) such as Si, Ge or Sn. However, the material constituting the first semiconductor layer 11 is not limited thereto. The first semiconductor layer 11 may be configured with various materials. In an embodiment of the disclosure, the first semiconductor layer 11 may include a gallium nitride (GaN) semiconductor material doped with the first conductive dopant (or n-type dopant). The first semiconductor layer 11 may include an upper surface in contact with the active layer 12 and a lower surface exposed to the outside along the length L direction of the light emitting element LD. The lower surface of the first semiconductor layer 11 may be the one end portion (or lower end portion) of the light emitting element LD.

The active layer 12 may be formed on the first semiconductor layer 11, and may be formed in a single or multiple quantum well structure. In an example, in the case of the active layer 12 is formed in the multiple quantum well structure, a barrier layer (not shown), a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and use a double hetero structure. In an embodiment of the disclosure, a clad layer (not shown) doped with a conductive dopant may be formed on the top and/or the bottom of the active layer 12 along the length L direction of the light emitting element LD. In an example, the clad layer may be formed as an AlGaN layer or InAlGaN layer. In some embodiments, a material such as AlGaN or AlInGaN may be used to form the active layer 12. The active layer 12 may be configured with various materials. The active layer 12 may include a first surface in contact with the first semiconductor layer 11 and a second surface in contact with the second semiconductor layer 13.

In the case that an electric field having a predetermined voltage or more is applied to both the end portions of the light emitting element LD, the light emitting element LD may emit light as electron-hole pairs are combined in the active layer 12. The light emission of the light emitting element LD may be controlled by using such a principle, so that the light emitting element LD can be used as a light source (or light emitting source) for various light emitting apparatuses, including a pixel of a display device.

The second semiconductor layer 13 may be formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg. However, the material constituting the second semiconductor layer 13 is not limited thereto. The second semiconductor layer 13 may be configured with various materials. In an embodiment of the disclosure, the second semiconductor layer 13 may include a gallium nitride (GaN) semiconductor material doped with the second conductive dopant (or p-type dopant). The second semiconductor layer 13 may include a lower surface in contact with the second surface of the active layer 12 and an upper surface exposed to the outside along the length L direction of the light emitting element LD. The upper surface of the second semiconductor layer 13 may be the other end portion (or upper end portion) of the light emitting element LD.

In an embodiment of the disclosure, the first semiconductor layer 11 and the second semiconductor layer 13 may have different thicknesses in the length L direction of the light emitting element LD. In an example, the first semiconductor layer 11 may have a thickness relatively thicker than that of the second semiconductor layer 13 along the length L direction of the light emitting element LD. Accordingly, the active layer 12 of the light emitting element LD may be located adjacent to the upper surface of the second semiconductor layer 13 than the lower surface of the first semiconductor layer 11.

Although it is illustrated that each of the first semiconductor layer 11 and the second semiconductor layer 13 may be configured with one layer, the disclosure is not limited thereto. In an embodiment of the disclosure, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAInP, p-AlInP or p-AlGaInP, but the disclosure is not limited thereto.

In some embodiments, the light emitting element LD may further include an additional electrode (not shown) (hereinafter, referred to as a 'first additional electrode') disposed on the top of the second semiconductor layer 13, in addition to the first semiconductor layer 11, the active layer 12, and the second semiconductor layer 13, which are described above. In other embodiments, the light emitting element LD may further include another additional electrode (not shown) (hereinafter, referred to as a 'second additional electrode') disposed at one end of the first semiconductor layer 11.

Each of the first and second additional electrodes may be an ohmic contact electrode, but the disclosure is not limited thereto. In some embodiments, each of the first and second additional electrodes may be a Schottky contact electrode. The first and second additional electrodes may include a conductive material. For example, the first and second additional electrodes may include an opaque metal using one or mixture of chromium (Cr), titanium (Ti), aluminum (Al), gold (Au), nickel (Ni), and any oxide or alloy thereof, but the disclosure is not limited thereto. In some embodiments, the first and second additional electrodes may include a transparent conductive oxide such as indium tin oxide (ITO), indium zinc oxide (IZO), zinc oxide (ZnO), indium gallium zinc oxide (ITZO), or indium tin zinc oxide (ITZO).

Materials respectively included in the first and second additional electrodes may be identical to or different from each other. The first and second additional electrodes may be substantially transparent or translucent. Accordingly, light generated in the light emitting element LD can be emitted to the outside of the light emitting element LD by passing through the first and second additional electrodes. In some embodiments, in the case of light generated in the light emitting element LD does not pass through the first and second additional electrodes and is emitted to the outside of the light emitting element LD through an area except both the end portions of the light emitting element LD, the first and second additional electrodes may include an opaque metal.

In an embodiment of the disclosure, the light emitting element LD may further include an insulative film 14. However, in some embodiments, the insulative film 14 may be omitted, and be provided to cover only portions of the first semiconductor layer 11, the active layer 12, and the second semiconductor layer 13.

The insulative film 14 can prevent an electrical short circuit that may occur in the case that the active layer 12 is in contact with a conductive material except the first semiconductor layer 11 and the second semiconductor layer 13. Also, the insulative film 14 minimizes a surface defect of the light emitting element LD, thereby improving the lifespan and light emission efficiency of the light emitting element LD. Also, in the case that light emitting elements LD are densely disposed, the insulative film 14 can prevent an unwanted short circuit that may occur between the light emitting elements LD. Whether the insulative film is provided is not limited as long as the active layer 12 can prevent occurrence of a short circuit with external conductive material.

The insulative film 14 may be provided in a shape entirely surrounding the outer circumference of the light emitting stack structure including the first semiconductor layer 11, the active layer 12, and the second semiconductor layer 13.

Although a case where the insulative film 14 is provided in a shape entirely surrounding the outer circumference of each of the first semiconductor layer 11, the active layer 12, and the second semiconductor layer 13 is described in the above-described embodiment, the disclosure is not limited thereto. In some embodiments, in the case that the light emitting element LD includes the first additional electrode, the insulative film 14 may entirely surround the outer circumference of each of the first semiconductor layer 11, the active layer 12, the second semiconductor layer 13, and the first additional electrode. In other embodiments, the insulative film 14 may not entirely surround the outer circumference of the first additional electrode, or may surround only a portion of the outer circumference of the first additional electrode and may not surround the other of the outer circumference of the first additional electrode. In some embodiments, in the case of the first additional electrode is disposed at the other end portion (or upper end portion) of the light emitting element LD and the second additional electrode is disposed at one end portion (or the other end portion) of the light emitting element LD, the insulative film 14 may expose at least one area of each of the first and second additional electrodes.

The insulative film 14 may include a transparent insulating material. For example, the insulative film 14 may include at least one insulating material selected from the group consisting of silicon oxide (SiOx), silicon nitride (SiNx), silicon oxynitride (SiON), aluminum oxide (AlOx), titanium dioxide ($TiO_2$), and the like. However, the disclosure is not limited thereto, and various materials having insulating properties may be used as the material of the insulative film 14. The insulating layer 14 may be provided in the form of a single-film or in the form of a multi-film including at least two films.

Figure 1B:
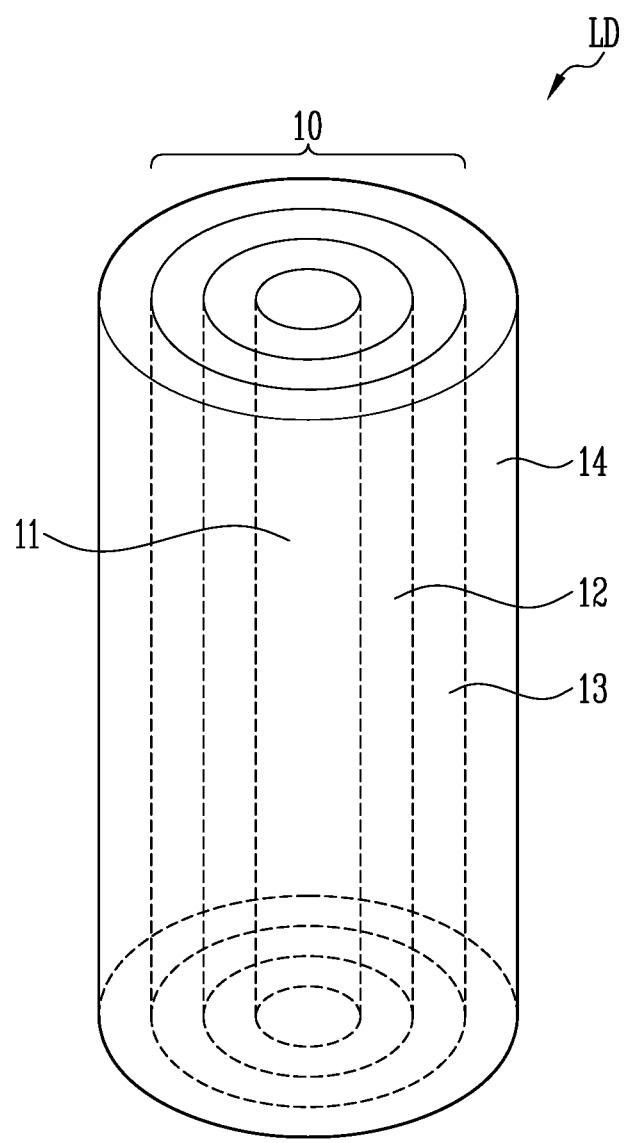
FIG. 1B is a perspective view schematically illustrating a light emitting element in accordance with another embodiment of the disclosure.
Figure 2B:
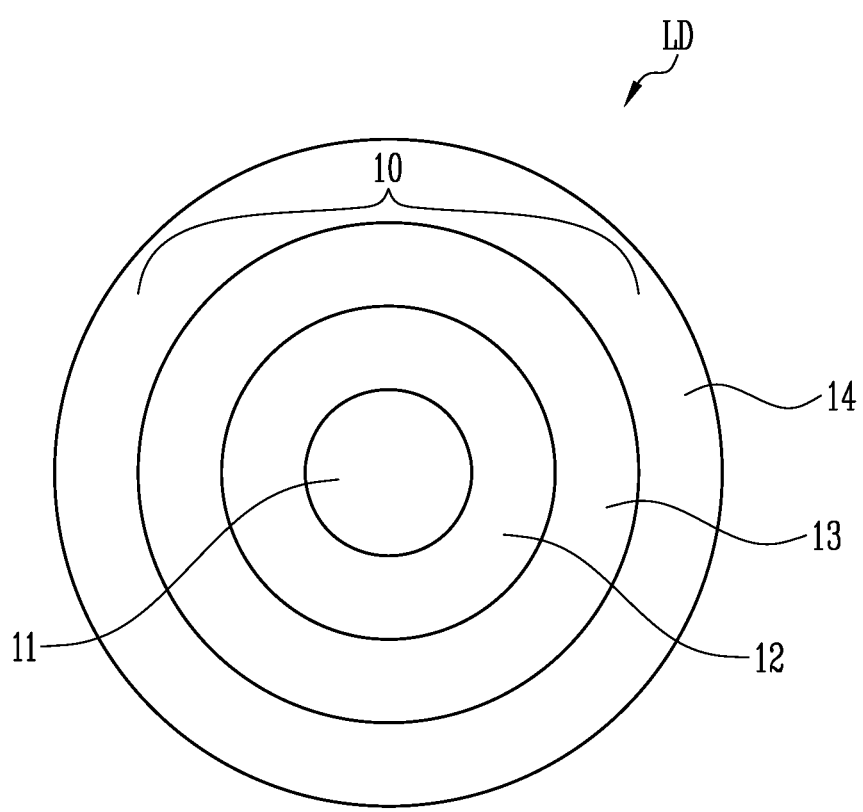
FIG. 2B is a sectional view of the light emitting element shown in FIG. 1B.

In FIGS. 1B and 2B, the light emitting element LD may include a light emitting pattern 10 having a core-shell structure. The first semiconductor layer 11 may be located at a core, i.e., the middle (or center) of the light emitting element LD, the active layer 12 may be provided and/or formed in a shape surrounding the outer circumference of the first semiconductor layer 11, and the second semiconductor layer 13 may be provided and/or formed in a shape surrounding the active layer 12. Also, the light emitting element LD may further include an additional electrode (not shown) surrounding at least one side of the second semiconductor layer 13. In some embodiments, the light emitting element LD may further include an insulative film 14 which may be provided on the outer circumference of the light emitting pattern 10 having the core-shell structure and may include a transparent insulating material. The light emitting element LD including the light emitting pattern 10 having the core-shell structure may be manufactured through a growth process.

The above-described light emitting element LD may be used as a light emitting source (or light source) for various display devices. The light emitting element LD may be manufactured through a surface treatment process. For example, in the case that light emitting elements LD are mixed in a liquid solution (or solvent) to be supplied to each pixel area (e.g., a light emitting area of each pixel or a light emitting area of each sub-pixel), each light emitting element LD may be surface-treated such that the light emitting elements LD are not unequally condensed in the solution but equally dispersed in the solution.

A light emitting unit (or light emitting apparatus) including the above-described light emitting element LD may be used in various types of devices that require a light source, including a display device. In the case that light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used for other types of devices that require a light source, such as a lighting device.

Figure 3:
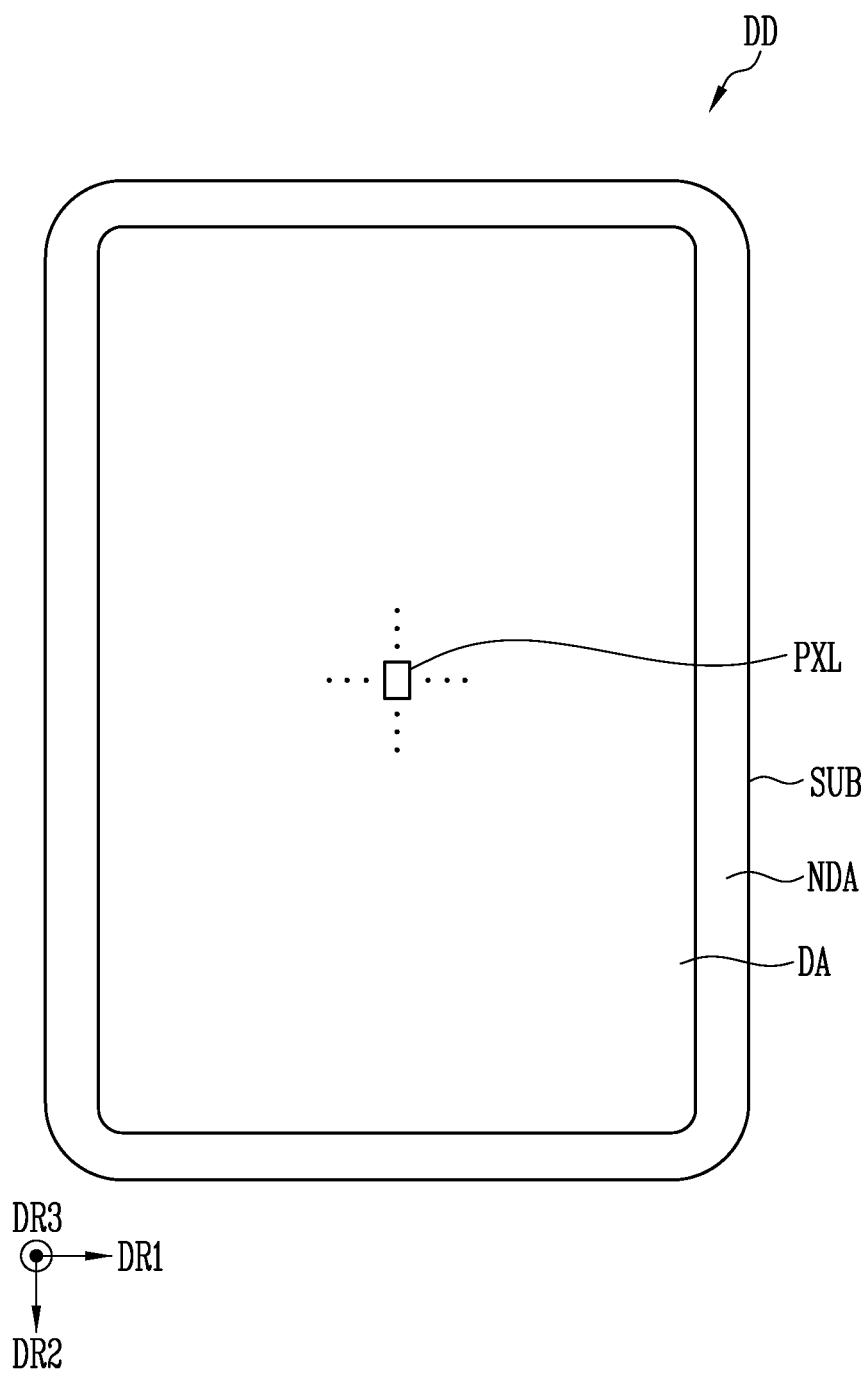
FIG. 3 is a schematic plan view illustrating a display device in accordance with an embodiment of the disclosure, and particularly, is a view of a display device using, as a light source, the light emitting element shown in FIGS. 1A and 2A.

FIG. 3 illustrates a display device in accordance with an embodiment of the disclosure, and particularly, is a schematic plan view of a display device using, as a light source, the light emitting element shown in FIGS. 1A and 2A.

In FIG. 3, for convenience, a structure of the display device DD is briefly illustrated based on a display area DA in which an image may be displayed.

Referring to FIGS. 1A, 2A and 3, the display device in accordance with the embodiment of the disclosure may include a substrate SUB, a plurality of pixels PXL which are provided on the substrate SUB and each may include at least one light emitting element LD, a driving unit which may be provided on the substrate SUB and drives the pixels PXL, and a line unit which connects the pixels PXL and the driving unit.

The disclosure may be applied as long as the display device may be an electronic device in which a display surface may be applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The display device may be classified into a passive matrix type display device and an active matrix type display device according to a method of driving the light emitting element LD. In an example, in the case that the display device is implemented as the active matrix type display device, each of the pixels PXL may include a driving transistor for controlling an amount of current supplied to the light emitting element LD, a switching transistor for transferring a data signal to the driving transistor, and the like.

The display device may be provided in various shapes. In an example, the display device may be provided in a rectangular plate shape having two pairs of sides parallel to each other, but the disclosure is not limited thereto. In the case that the display device is provided in the rectangular plate shape, any one pair of sides among the two pairs of sides may be provided longer than the other pair of sides. For convenience, a case where the display device may be provided in a rectangular shape having a pair of long sides and a pair of short sides is illustrated. An extending direction of the long sides may be represented as a second direction DR2, an extending direction of the short sides may be represented as a first direction DR1, and a direction perpendicular to the extending directions of the long sides and the short sides may be represented as a third direction DR3. In the display device provided in the rectangular plate shape, a corner portion at which one long side and one short side may be in contact with (or meet) each other may have a round shape, but the disclosure is not limited thereto.

The substrate SUB may include the display area DA and a non-display area NDA.

The display area DA may be an area in which the pixels PXL for displaying an image are provided. The non-display area NDA may be an area in which the driving unit for driving the pixels PXL and a portion of the line unit which connects the pixels PXL and the driving unit are provided. For convenience, only one pixel PXL is illustrated in FIG. 3, but a plurality of pixels PXL may be substantially provided in the display area DA of the substrate SUB.

The non-display area NDA may be provided at at least one side of the display area DA. The non-display area NDA may surround the circumference (or edge) of the display area DA. The non-display area NDA may be provided with the line unit connected to the pixels PXL and the driving unit which may be electrically connected to the line part and drives the pixels PXL.

The line unit may electrically connect the driving unit and the pixels PXL. The line unit may be a fan-out line which provides a signal to each pixel PXL and is electrically connected to signal lines, e.g., a scan line, a data line, an emission control line, and the like, which are electrically connected to each pixel PXL. Also, the line unit may be a fan-out line electrically connected to signal lines, e.g., a control line, a sensing line, and the like, which are electrically connected to each pixel PXL, so as to compensate for an electrical characteristic change of each pixel PXL in real time.

The substrate SUB may include a transparent insulating material to enable light to be transmitted therethrough. The substrate SUB may be a rigid substrate or a flexible substrate.

One area on the substrate SUB may be provided as the display area DA such that the pixels PXL are disposed therein, and the other area on the substrate SUB may be provided as the non-display area NDA. In an example, the substrate SUB may include the display area DA including pixel areas in which the respective pixels PXL are disposed and the non-display area NDA disposed at the periphery of the display area DA (or adjacent to the display area DA).

Each of the pixels PXL may be provided in the display area DA. In an embodiment of the disclosure, the pixels PXL may be arranged (disposed) in a stripe or pentile arrangement structure in the display area DA, but the disclosure is not limited thereto.

Each pixel PXL may include at least one light emitting element LD driven by a corresponding scan signal and a corresponding data signal. The light emitting element LD may have a size small to a degree of nano scale to micro scale, and be connected in parallel to light emitting elements disposed adjacent thereto. However, the disclosure is not limited thereto. The light emitting element LD may constitute a light source of each pixel PXL.

Each pixel PXL may include at least one light source, e.g., the light emitting element LD shown in FIG. 1A, which may be driven by a predetermined signal (e.g., a scan signal and a data signal) and/or a predetermined power source (e.g., a first driving power source and a second driving power source). However, in the embodiment of the disclosure, the kind of the light emitting element LD which can be used as the light source of the pixel PXL is not limited thereto.

The driving unit provides a predetermined signal and a predetermined power source to each pixel PXL through the line unit, and accordingly, the driving of the pixel PXL can be controlled. The driving unit may include a scan driver, an emission driver, a data driver, and a timing controller.

Figure 4:
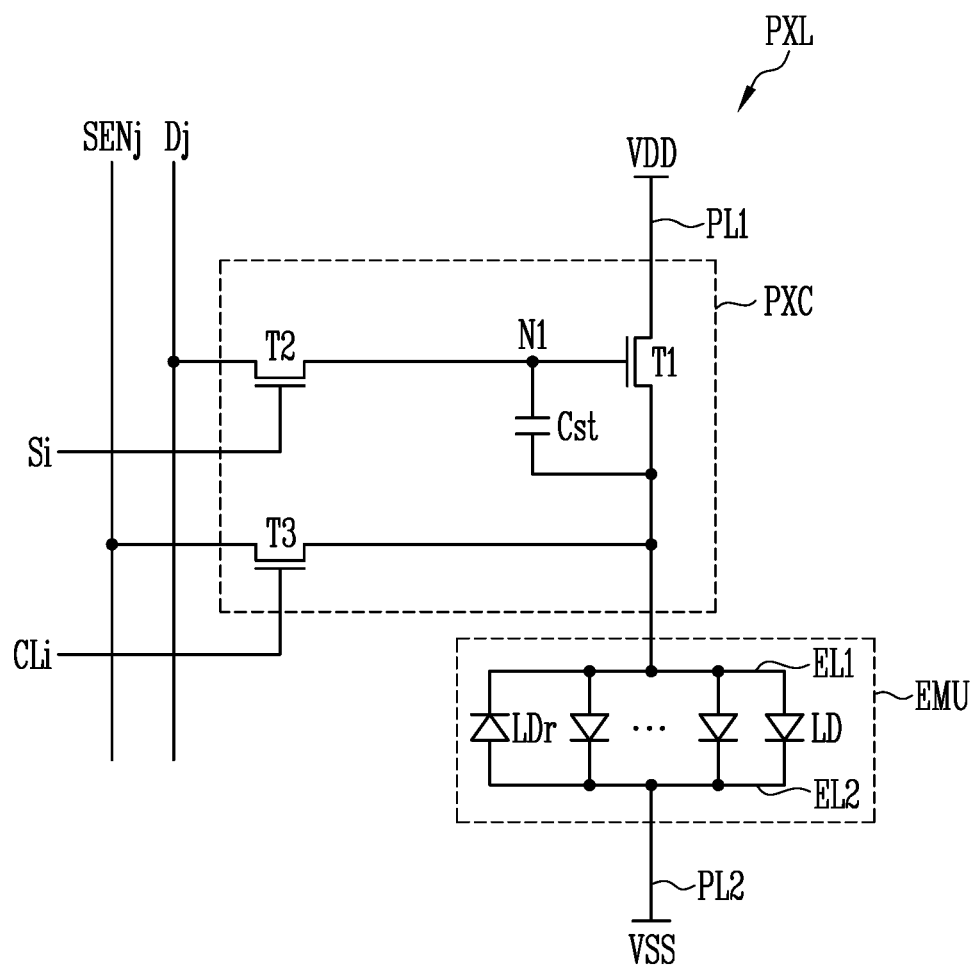
FIG. 4 is a circuit diagram illustrating an embodiment of an electrical connection relationship between components included in one pixel shown in FIG. 3.

FIG. 4 is a circuit diagram illustrating an embodiment of an electrical connection relationship between components included in one pixel shown in FIG. 3.

For example, FIG. 4 illustrates an embodiment of an electrical connection relationship between components included in the pixel PXL applicable to an active display device. However, the kinds of the components included in the pixel PXL to which the embodiment of the disclosure is applicable are not limited thereto.

In FIG. 4, the pixel PXL comprehensively may include not only components included in each of the pixels shown in FIG. 3 but also an area in which the components are provided.

Referring to FIGS. 1A, 2A, 3 and 4, one pixel PXL (hereinafter, referred to as a 'pixel') may include a light emitting unit EMU which generates light with a luminance corresponding to a data signal. Also, the pixel PXL may selectively further include a pixel circuit PXC for driving the light emitting unit EMU.

In some embodiments, the light emitting unit EMU may include light emitting elements LD electrically connected in parallel between a first power line PL1 to which a voltage of a first driving power source VDD may be applied and a second power line PL2 to which a voltage of a second driving power source VSS may be applied. For example, the light emitting unit EMU may include a first electrode EL1 (or "first alignment electrode") electrically connected to the first driving power source VDD via the pixel circuit PXC and the first power line PL1, a second electrode EL2 (or "second alignment electrode") electrically connected to the second driving power source VSS through the second power line PL2, and light emitting elements LD electrically connected in parallel in the same direction between the first and second electrodes EL1 and EL2. In an embodiment of the disclosure, the first electrode EL1 may be an anode electrode, and the second electrode EL2 may be a cathode electrode.

Each of the light emitting elements LD included in the light emitting unit EMU may include one end portion electrically connected to the first driving power source VDD through the first electrode EL1 and the other end portion electrically connected to the second driving power source VSS through the second electrode EL2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to a threshold voltage of the light emitting elements LD during an emission period of the pixel PXL.

As described above, the light emitting elements LD electrically connected in parallel in the same direction (e.g., a forward direction) between the first electrode EL1 and the second electrode EL2, to which voltages having difference potentials are supplied, may form effective light sources, respectively. The effective light sources may constitute the light emitting unit EMU of the pixel PXL.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU can emit light with a luminance corresponding to the driving current while each light emitting element LD may be emitting light with a luminance corresponding to a current flowing therethrough.

Meanwhile, although an embodiment in which both the end portions of the light emitting elements LD are connected in the same direction between the first and second driving power sources VDD and VSS has been illustrated, the disclosure is not limited thereto. In some embodiments, the light emitting unit EMU may further include at least one ineffective light source, e.g., a reverse light emitting element LDr, in addition to the light emitting elements LD forming the respective effective light sources. The reverse light emitting element LDr may be electrically connected in parallel together with the light emitting elements LD forming the effective light sources between the first and second electrodes EL1 and EL2, and may be electrically connected between the first and second electrodes EL1 and EL2 in a direction opposite to that in which the light emitting elements LD are connected. Although a predetermined driving voltage (e.g., a forward driving voltage)may be applied between the first and second electrodes EL1 and EL2, the reverse light emitting element LDr maintains an inactive state, and accordingly, no current substantially flows through the reverse light emitting element LDr.

The pixel circuit PXC may be electrically connected to a scan line Si and a data line Dj of a corresponding pixel PXL. In an example, in the case of assuming that a pixel PXL is disposed on an ith (i is a natural number) row and a jth (j is a natural number) column of the display area DA, the pixel circuit PXC of the pixel PXL may be electrically connected to an ith scan line Si and a jth data line Dj of the display area DA. Also, the pixel circuit PXC may be electrically connected to an ith control line CLi and a jth sensing line SENj of the display area DA.

The above-described pixel circuit PXC may include first to third transistors T1 to T3 and a storage capacitor Cst.

A first terminal of the first transistor T1 (driving transistor) may be electrically connected to the first driving power source VDD, and a second terminal of the first transistor T1 may be electrically connected to the first electrode EL1 of each of the light emitting elements LD. A gate electrode of the first transistor T1 may be electrically connected to a first node N1. The first transistor T1 may control of an amount of driving current supplied to the light emitting element LD, corresponding to a voltage of the first node N1.

A first terminal of the second transistor T2 (switching transistor) may be electrically connected to the jth data line Dj, and a second terminal of the second transistor T2 may be electrically connected to the first node N1. The first terminal and the second terminal of the second transistor T2 are different terminals. For example, in the case that the first terminal is a source electrode, the second terminal may be a drain electrode. A gate electrode of the second transistor T2 may be electrically connected to the ith scan line Si.

The second transistor T2 may be turned on when a scan signal having a voltage at which the second transistor T2 can be turned on is supplied from the ith scan line Si, to electrically connect the jth data line Dj and the first node N1. A data signal of a corresponding frame may be supplied to the jth data line Dj. Accordingly, the data signal may be transferred to the first node N1. The data signal transferred to the first node N1 may be charged in the storage capacitor Cst.

The third transistor T3 may be electrically connected between the first transistor T1 and the jth sensing line SENj. For example, a first terminal of the third transistor T3 may be electrically connected to the first terminal (e.g., a source electrode) of the first transistor T1 electrically connected to the first electrode EL1, and a second terminal of the third transistor T3 may be electrically connected to the jth sensing line SENj. A gate electrode of the third transistor T3 may be electrically connected to the jth control line CLi. The third transistor T3 may be turned on by a control signal having a gate-on voltage, which may be supplied to the ith control line CLi during a predetermined sensing period, to electrically connect the jth sensing line SENj and the first transistor T1.

The sensing period may be a period in which characteristic information (e.g., a threshold voltage of the first transistor T1, etc.) of each of the pixels PXL arranged in the display area DA.

One electrode of the storage capacitor Cst may be electrically connected to the first driving power source VDD, and the other electrode of the storage capacitor Cst may be electrically connected to the first node N1. The storage capacitor Cst may charge a voltage corresponding to the data signal supplied to the first node N1, and maintain the charged voltage until a data signal of a next frame may be supplied.

Although an embodiment in which all the first to third transistors T1, T2, and T3 are N-type transistors is illustrated in FIG. 4, the disclosure is not limited thereto. For example, at least one of the first to third transistors T1, T2, and T3 may be replaced with a P-type transistor. Also, although an embodiment in which the light emitting unit EMU may be electrically connected between the pixel circuit PXC and the second driving power source VSS is illustrated in FIG. 4, the light emitting unit EMU may be electrically connected between the first driving power source VDD and the pixel circuit PXC.

The structure of the pixel circuit PXC may be variously modified and embodied. In an example, the pixel circuit PXC may further include at least one transistor such as a transistor for initializing the first node N1 and/or a transistor for controlling an emission time of the light emitting elements LD, or other circuit elements such as a boosting capacitor for boosting the voltage of the first node N1.

Also, although an embodiment in which the light emitting elements LD constituting each light emitting unit EMU are all electrically connected in parallel has been illustrated in FIG. 4, the disclosure is not limited thereto. In some embodiments, the light emitting unit EMU may be configured to include at least one serial stage including light emitting elements LD electrically connected in parallel to each other. For example, the light emitting unit EMU may be configured in a series/parallel hybrid structure.

The structure of a pixel PXL applied to the disclosure is not limited to the embodiment shown in FIG. 4, and the corresponding pixel PXL may have various structures. For example, each pixel PXL may be configured at the inside of a passive type light emitting display device, etc. The pixel circuit PXC may be omitted, and both the end portions of the light emitting elements LD included in the light emitting unit EMU may be directly connected to the ith scan line Si, the jth data line Dj, the first power line PL1 to which the first driving power source VDD may be applied, the second power line PL2 to which the second driving power source VSS may be applied, and/or a predetermined control line.

Figure 5:
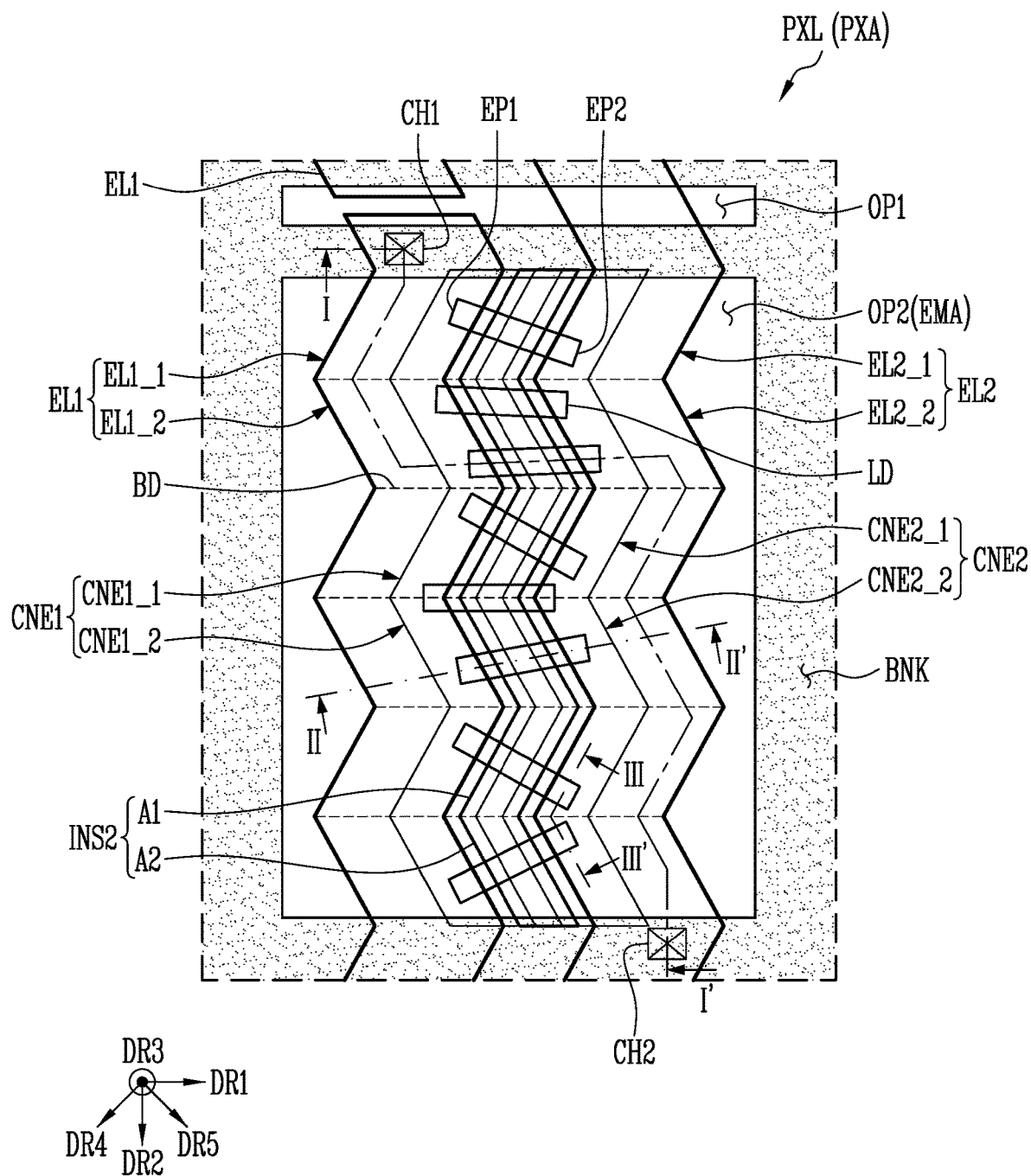
FIG. 5 is a schematic plan view illustrating one pixel among pixels shown in FIG. 3.
Figure 6A:
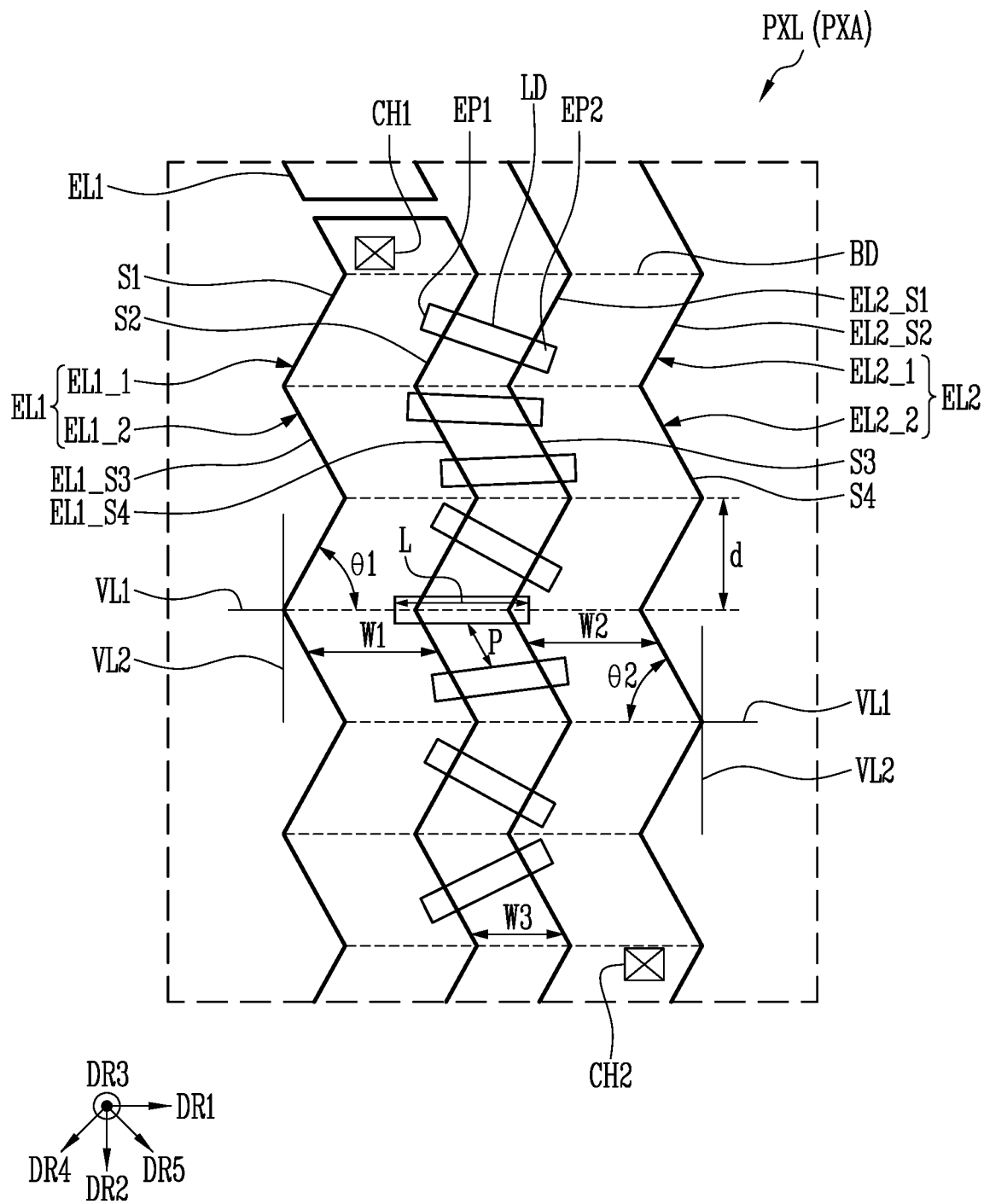
FIG. 6A is a schematic plan view illustrating only first and second electrodes and light emitting elements in the pixel shown in FIG. 5.
Figure 6B:
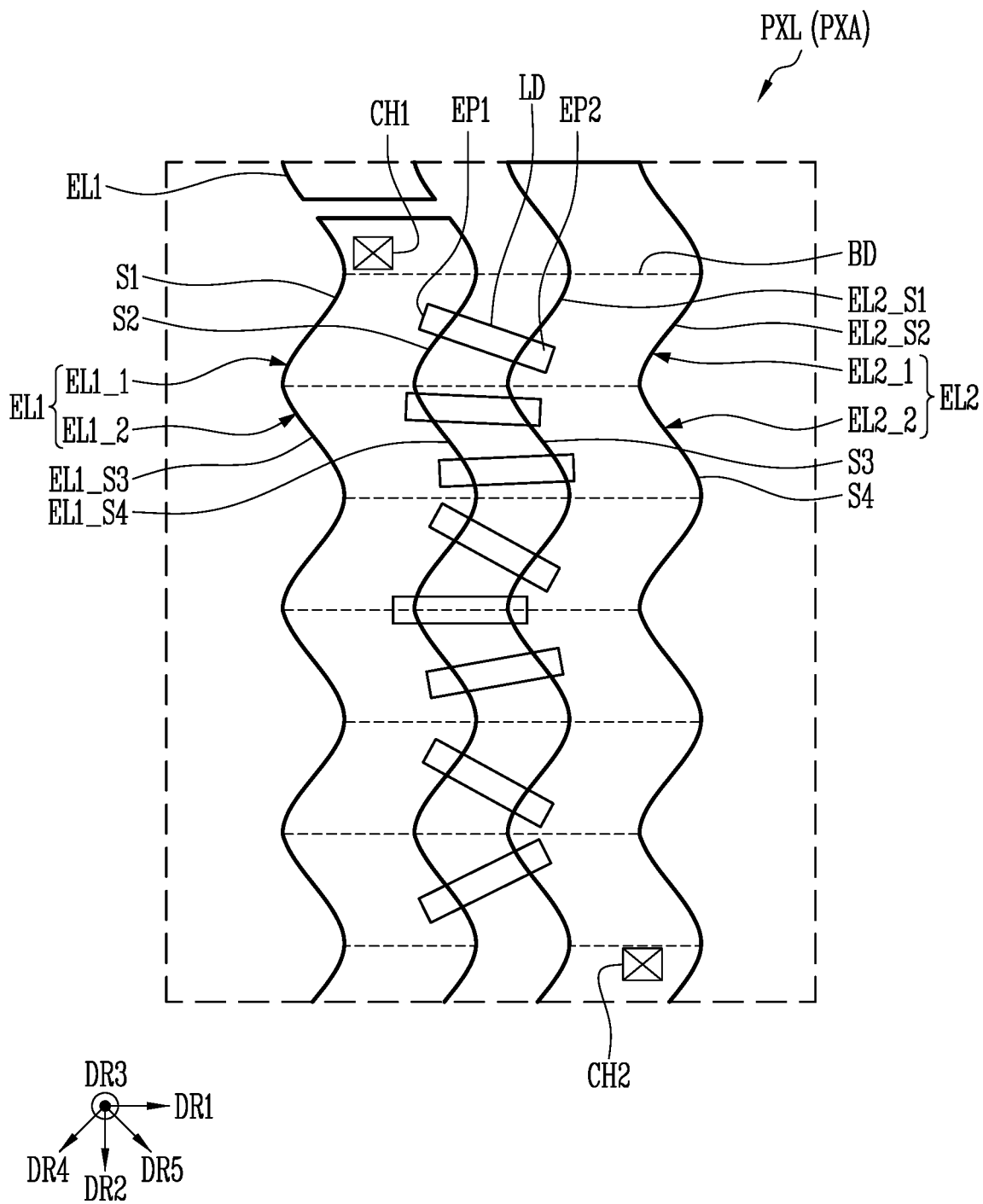
FIG. 6B is a schematic plan view illustrating another embodiment of the first and second electrodes shown in FIG. 6A.

FIG. 5 is a plan view schematically illustrating one pixel among the pixels shown in FIG. 3. FIG. 6A is a schematic plan view illustrating only first and second electrodes and light emitting elements in the pixel shown in FIG. 5. FIG. 6B is a schematic plan view illustrating another embodiment of the first and second electrodes shown in FIG. 6A.

In FIG. 5, illustration of transistors T electrically connected to light emitting elements LD and signal lines electrically connected to the transistors T is omitted for convenience of description.

In an embodiment of the disclosure, for convenience of description, a lateral direction (or horizontal direction) in a plan view (or on a plane) is designated as a first direction DR1, a longitudinal direction (or vertical direction) in a plan view (or on a plane) is designated as a second direction DR2, a thickness direction of the substrate SUB on a section is designated as a third direction DR3, an oblique direction inclined with respect to the second direction DR2 is designated as a fourth direction DR4, and an oblique direction inclined with respect to the first direction DR1 is designated as a fifth direction DR5.

Referring to FIGS. 3 and 5 to 6B, each pixel PXL may be formed in a pixel area PXA arranged (or provided) on the substrate SUB. The pixel area PXA may include an emission area EMA and a peripheral area. In an embodiment, the peripheral circuit may include a non-emission area in which no light is emitted.

In some embodiments, the pixel PXL may include a bank BNK located in the peripheral area.

The bank BNK may be a structure defining (or partitioning) a pixel area PXA or an emission area of each of a corresponding pixel PXL and pixels PXL adjacent thereto. In an example, the bank BNK may be a pixel defining layer. In an embodiment, in a process of supplying light emitting elements LD to each pixel PXL, the bank BNK may be a pixel defining layer or a dam structure, which defines each emission area EMA to which the light emitting elements LD are to be supplied. In an example, an emission area EMA of each pixel PXL may be partitioned by the bank BNK, so that a mixed liquor (e.g., ink) including a desired amount and/or a desired kind of light emitting elements LD can be supplied (or input) to the emission area EMA.

The bank BNK may include at least one light blocking material and/or at least one reflective material, to prevent a light leakage defect in which light (or beam)may be leaked between each pixel PXL and pixels PXL adjacent thereto. In some embodiments, the bank BNK may include a transparent material (or substance). In an example, the transparent material may include polyamides resin, polyimides resin, etc., but the disclosure is not limited thereto. In another embodiment, a reflective material layer may be separately provided and/or formed on the bank BNK so as to further improve the efficiency of light emitted from each pixel PXL.

The bank BNK may include at least one opening exposing components located under the bank BNK in a pixel area PXA of a corresponding pixel PXL. An emission area EMA of the corresponding pixel PXL may be defined by the opening of the bank BNK. In an example, the bank BNK may include a first opening OP1 and a second opening OP2, which expose the components located under the bank BNK in the pixel area PXA of the corresponding pixel PXL. The emission area EMA of each pixel PXL may be defined by the second opening OP2 of the bank BNK.

In the pixel area PXA, the first opening OP1 of the bank BNK may be located to be spaced apart from the second opening OP2, and be located adjacent to one side (e.g., an upper side or lower side) of the pixel region PXA. In an example, the first opening OP1 of the bank BNK may be located at the upper side of the pixel area PXA.

Each pixel PXL may include a first electrode EL1 and a second electrode EL2, which are spaced apart from each other in the first direction DR1. The first electrode EL1 may correspond to the first electrode EL1 described with reference to FIG. 4, and the second electrode EL2 may correspond to the second electrode EL2 described with reference to FIG. 4.

The first electrode EL1 may be separated from a first electrode (not shown) provided in each of other pixels (e.g., adjacent pixels PXL adjacent to each other in the second direction DR2) after light emitting elements LD are supplied and arranged in the pixel area PXA in a manufacturing process of the display device. For example, the first opening of the bank BNK may be provided to perform a separation process on the first electrode EL1.

The first electrode EL1 may be electrically connected to the first transistor T1 described with reference to FIG. 4 through a first contact hole CH1, and the second electrode EL2 may be electrically connected to the second driving power source VSS (or the second power line PL2) described with reference to FIG. 4.

The first electrode EL1 and the second electrode EL2 may have a multi-layered structure including a reflective electrode and a conductive capping layer. The reflective electrode may have a single- or multi-layered structure. In an example, the reflective electrode may include at least one opaque metal layer, and selectively further include at least one transparent conductive layer disposed on the top and/or bottom of the opaque metal layer.

The first electrode EL1 may include at least one (1-1)th electrode EL1_1 and at least one (1-2)th electrode EL1_2. The second electrode EL2 may include at least one (2-1)th electrode EL2_1 and at least one (2-2)th electrode EL2_2.

In a plan view, the (1-1)th electrode EL1_1 may extend along the fourth direction DR4 inclined in a diagonal direction in the second direction DR2. In a plan view, the (1-2)th electrode EL1_2 may extend along the fifth direction DR5 inclined in a diagonal direction in the first direction DR1. The fifth direction DR5 may intersect with the fourth direction DR4.

In a plan view, the (2-1)th electrode EL2_1 may extend along the fourth direction DR4, and the (2-2)th electrode EL2_2 may extend along the fifth direction.

In an embodiment, the (1-1)th electrode EL1_1 and the (1-2)th electrode EL1_2 may be alternately arranged along the second direction DR2. The (1-1)th electrode EL1_1 and the (1-2)th electrode EL1_2 may form a mirror symmetry with respect to a boundary BD between the (1-1)th electrode EL1_1 and the (1-2)th electrode EL1_2. In an example, the (1-1)th electrode EL1_1 and the (1-2)th electrode EL1_2 may form a vertical symmetry with respect to the boundary BD.

In an embodiment, the (2-1)th electrode EL2_1 and the (2-2)th electrode EL2_2 may be alternately arranged along the second direction DR2. The (2-1)th electrode EL2_1 and the (2-2)th electrode EL2_2 may form a mirror symmetry with respect to a boundary BD between the (2-1)th electrode EL2_1 and the (2-2)th electrode EL2_2. In an example, the (2-1)th electrode EL2_1 and the (2-2)th electrode EL2_2 may form a vertical symmetry with respect to the boundary BD.

The (1-1)th electrode EL1_1 may correspond to the (2-1)th electrode EL2_1, and the (1-2)th electrode EL1_2 may correspond to the (2-2)th electrode EL2_2. In an embodiment, the (1-1)th electrode EL1_1 may be disposed to be spaced apart from the (2-1)th electrode EL2_1 in the first direction DR1, and the (1-2)th electrode EL1_2 may be disposed to be spaced apart from the (2-2)th electrode EL2_2 in the first direction DR1.

The (1-1)th electrode EL1_1 may include first and second side surfaces S1 and S2, which are inclined at a predetermined angle θ1 (hereinafter, referred to as a 'first angle') toward a second virtual line VL2 perpendicular to a first virtual line VL1 extending from the boundary BD from the first virtual line VL1. The first side surface S1 and the second side surface S2 may have the same inclination. The (2-1)th electrode EL2_1 may include a first side surface EL2_S1 having the same inclination as the first side surface S1 of the (1-1)th electrode EL1_1, and include a second side surface EL2_S2 having the same inclination as the second side surface S2 of the (1-1)th electrode EL1_1.

The (1-1)th electrode EL1_1 and the (2-1)th electrode EL2_1 may have the same planar shape. In an example, the (1-1)th electrode EL1_1 and the (2-1)th electrode EL2_1 may have a polygonal shape having an inclination corresponding to the fourth direction DR4. A width W1 of the (1-1)th electrode EL1_1 in the first direction DR1 and a width W2 of the (2-1)th electrode EL2_1 in the first direction DR1 may be equal to each other.

The (2-2)th electrode EL2_2 may include third and fourth side surfaces S3 and S4, which are inclined at a predetermined angle θ2 (hereinafter, referred to as a 'second angle') toward a second virtual line VL2 from a first virtual line VL1 extending from the boundary BD. The third side surface S3 and the fourth side surface S4 may have the same inclination. The (1-2)th electrode EL1_2 may include a third side surface EL1_S3 having the same inclination as the third side surface S3 of the (2-2)th electrode EL2_2, and include a fourth side surface EL1_S4 having the same inclination as the fourth side surface S4 of the (2-2)th electrode EL2_2. In an embodiment, the first angle θ1 and the second angle θ2 may be the same.

The (1-2)th electrode EL1_2 and the (2-2)th electrode EL2_2 may have the same planar shape. In an example, the (1-2)th electrode EL1_2 and the (2-2)th electrode EL2_2 may have a polygonal shape having an inclination corresponding to the fifth direction DR5. A width of the (1-2)th electrode EL1_2 in the first direction DR1 and a width of the (2-2)th electrode EL2_2 in the first direction DR1 may be equal to each other.

In a pixel area PXA of each pixel PXL, a width W3 of an area between the first electrode EL1 and the second electrode EL2 in the first direction DR1 may be constant along an extending direction of the first and second electrodes EL1 and EL2, e.g., along the second direction DR2.

In an embodiment, each of the (1-1)th electrode EL1_1, the (1-2)th electrode EL1_2, the (2-1)th electrode EL2_1, and the (2-2)th electrode EL2_2 may be designed such that a width d (or length) in the second direction DR2 may be smaller than a length L of each of the light emitting elements LD.

The first electrode EL1 including the (1-1)th electrode EL1_1 and the (1-2)th electrode EL1_2, which are alternately arranged along the second direction DR2, and the second electrode EL2 including the (2-1)th electrode EL2_1 and the (2-2)th electrode EL2_2, which are alternately arranged along the second direction DR2, may have the same planar shape in the emission area EMA of each pixel PXL. In an example, the first electrode EL1 and the second electrode EL2 may form a bilateral symmetry along the second direction DR2 in the emission area EMA. In the emission area EMA, the first electrode EL1 and the second electrode EL2 may have a zigzag shape in a plan view.

Although a case where the first electrode EL1 and the second electrode EL2 are provided in a zigzag shape form with a straight line having a predetermined inclination has been described in the above-described embodiment, the disclosure is not limited thereto. In some embodiments, the first electrode EL1 and the second electrode EL2 may be provided in a shape including a curve having a predetermined curvature as shown in FIG. 6B. The first side surface S1 of the (1-1)th electrode EL1_1 and the first side surface EL2_S1 of the (2-1)th electrode EL2_1 may have the same curvature, and the second side surface S2 of the (1-1)th electrode EL1_1 and the second side surface EL2_S2 of the (2-1)th electrode EL2_1 may have the same curvature. The third side surface S3 of the (2-2)th electrode EL2_2 and the third side surface EL1_S3 of the (1-2)th electrode EL1_2 may have the same curvature, and the fourth side surface S4 of the (2-2)th electrode EL2_2 and the fourth side surface EL1_S4 of the (1-2)th electrode EL1_2 may have the same curvature.

Each pixel PXL may have light emitting elements LD. In some embodiments, each pixel PXL may further include the reverse light emitting element LDr described with reference to FIG. 4.

The light emitting elements LD may be disposed between the first electrode EL1 and the second electrode EL2. Each of the light emitting elements LD may include a first end portion EP1 (or one end portion) and a second end portion EP2 (or the other end portion), which are located both ends in a length L direction thereof. In an embodiment, a p-type semiconductor layer may be located at the first end portion EP1, and an n-type semiconductor layer may be located at the second end portion EP2. The p-type semiconductor layer may be the second semiconductor layer 13 described with reference to FIG. 1A, and the n-type semiconductor layer may be the first semiconductor layer 11 described with reference to FIG. 1A. The light emitting elements LD may be electrically connected in parallel to each other between the first electrode EL1 and the second electrode EL2. Each of the light emitting elements LD may have the same configuration as the light emitting element LD described with reference to FIGS. 1A and 2A.

In an embodiment, the first end portion EP1 of each of the light emitting elements LD may not be directly provided on the first electrode EL1, but may be electrically connected to the first electrode EL1 through at least one contact electrode, e.g., a first contact electrode CNE1. The second end portion EP2 of each of the light emitting elements LD may not be directly provided on the second electrode EL2, but may be electrically connected to the second electrode EL2 through at least another contact electrode, e.g., a second contact electrode CNE2.

Each of the light emitting elements LD may be a light emitting diode having a micro size, e.g., a size small to a degree of nano scale to micro scale, which may be manufactured by using a material having an inorganic crystalline structure. For example, each of the light emitting elements LD may be a micro light emitting diode manufactured through an etching process or a micro light emitting diode manufactured through a growth process.

At least two light emitting elements LD to a few tens of light emitting elements LD may be aligned and/or provided in the emission area EMA of each pixel PXL, but a number of the light emitting elements LD is not limited thereto. In some embodiments, the number of the light emitting elements LD aligned and/or provided in the emission area EMA may be variously changed.

Each of the light emitting elements LD may emit any one of colored light and/or white light. Each of the light emitting elements LD may be aligned between the first electrode EL1 and the second electrode EL2 such that the extending direction (or the length L direction) thereof corresponds to an oblique direction inclined with respect to the first direction DR1 or the second direction DR2. The light emitting elements LD may be provided in a form in which the light emitting elements LD are sprayed in a solution, to be input (or supplied) to the emission area EMA of each pixel PXL.

The light emitting elements LD may be input (or supplied) to the emission area EMA of each pixel through an inkjet printing process, a slit coating process, or various processes. In an example, the light emitting elements LD may be mixed with a volatile solvent, to be input (or supplied) to the emission area EMA through an inkjet printing process or a slit coating process. In the case that a corresponding alignment signal is applied to the first electrode EL1 and the second electrode EL2, an electric field may be formed between the first electrode EL1 and the second electrode EL2. Therefore, the light emitting elements LD may be aligned between the first electrode EL1 and the second electrode EL2. After the light emitting elements LD are aligned, the solvent may be volatilized or be removed through another process, so that the light emitting elements LD can be stably aligned between the first electrode EL1 and the second electrode EL2.

In an embodiment, each pixel PXL may include a second insulating layer INS2, the first contact electrode CNE1, and the second contact electrode CNE2.

The second insulating layer INS2 may overlap with each of the light emitting s LD, and expose both the end portions EP1 and EP2 of each of the light emitting element LD.

The second insulating layer INS2 may be configured as a single layer or a multi-layer, and include an inorganic insulating layer including at least one inorganic material or an organic insulating layer include at least one organic material. The second insulating layer INS2 may further fix each of the light emitting elements LD. The second insulating layer INS2 may include an inorganic insulating layer advantageous in protecting the active layer 12 of each of the light emitting elements LD. However, the disclosure is not limited thereto. The second insulating layer INS2 may be configured as an organic insulating layer including an organic material according to a design condition of the display device in which the above-described light emitting elements LD are applied as a light source.

After the alignment of the light emitting elements LD in the emission area EMA (or the pixel area PXA) of each of the pixels PXL may be completed, the second insulating layer INS2 may be formed on the light emitting elements LD, so that the light emitting elements LD can be prevented from being separated from positions at which the light emitting elements LD are aligned.

In an embodiment of the disclosure, the second insulating layer INS2 may be designed to have a shape corresponding to that of the first and second electrodes EL1 and EL2. In an example, the second insulating layer INS2 may be designed to include a first area A1 extending in the fourth direction DR4 and a second area A2 extending in the fifth direction DR5. This is for the purpose of stably fixing the light emitting elements LD by designing the second insulating layer INS2 to the arrangement direction of the light emitting elements LD. The first area A1 and the second area A2 of the second insulating layer INS2 may form a mirror symmetry with respect to a boundary BD located therebetween.

The first area A1 of the second insulating layer INS2 may correspond to the (1-1)th and (2-1)th electrodes EL1_1 and EL2_1. The first area A1 of the second insulating layer INS2 may be provided and/or formed on light emitting elements LD aligned between the (1-1)th electrode EL1_1 and the (2-1)th electrode EL2_1 to expose both the end portions EP1 and EP2 of each of the light emitting elements LD.

The second area A2 of the second insulating layer INS2 may correspond to the (1-2)th and (2-2)th electrodes EL1_2 and EL2_2. The second area A2 of the second insulating layer INS2 may be provided and/or formed on light emitting elements LD aligned between the (1-2)th electrode EL1_2 and the (2-2)th electrode EL2_2 to expose both the end portions EP1 and EP2 of each of the light emitting element LD.

The first contact electrode CNE1 may be provided and/or formed on the first end portion EP1 of each of the light emitting elements LD and one area of the first electrode EL1, which corresponds thereto, to physically and/or electrically connect the first end portion EP1 of each of the light emitting elements LD to the first electrode EL1.

In an embodiment of the disclosure, the first contact electrode CNE1 may have a shape corresponding to that of the first electrode EL1. In an example, the first contact electrode CNE1 may include a (1-1)th contact electrode CNE1_1 extending in the fourth direction DR4 and a (1-2)th contact electrode CNE1_2 extending in the fifth direction DR5 intersecting the fourth direction DR4. The (1-1)th contact electrode CNE1_1 and the (1-2)th contact electrode CNE1_2 may be alternately arranged along the second direction DR2. The first contact electrode CNE1 may have a zigzag shape having a predetermined inclination in a plan view.

The second contact electrode CNE2 may be provided and/or formed on the second end portion EP2 of each of the light emitting elements LD and one area of the second electrode EL2, which corresponds thereto, to physically and/or electrically connect the second end portion EP2 of each of the light emitting elements LD to the second electrode EL2.

In an embodiment of the disclosure, the second contact electrode CNE2 may have a shape corresponding to that of the second electrode EL2. In an example, the second contact electrode CNE2 may include a (2-1)th contact electrode CNE2_1 extending in the fourth direction DR4 and a (2-2)th contact electrode CNE2_2 extending in the fifth direction DR5. The (2-1)th contact electrode CNE2_1 and the (2-2)th contact electrode CNE2_2 may be alternately arranged along the second direction DR2. The second contact electrode CNE2 may have a zigzag shape having a predetermined inclination in a plan view.

The first contact electrode CNE1 and the second contact electrode CNE2 may from a bilateral symmetry along the second direction DR2 in the emission area EMA of each pixel PXL.

As described above, since the (1-1)th and (2-1)th electrodes EL1_1 and EL2_1 and the (1-2)th and (2-2)th electrodes EL1_2 and EL2_2 have different extending directions, an electric field direction formed between the (1-1)th and (2-1)th electrodes EL1_1 and EL2_1 may be different from that formed between the (1-2)th and (2-2)th electrodes EL1_2 and EL2_2. Light emitting elements LD (hereinafter, referred to as 'first light emitting elements') disposed between the (1-1)th and (2-1)th electrodes EL1_1 and EL2_1 extending along the fourth direction DR4 may be aligned in a direction different from that of light emitting elements LD (hereinafter, referred to as 'second light emitting elements') disposed between the (1-2)th and (2-2)th electrodes EL1_2 and EL2_2 extending along the fifth direction DR5. In an example, some of light emitting elements LD between the first electrode EL1 and the second electrode EL2 may be aligned between the first electrode EL1 and the second electrode EL2 such that the length L direction thereof corresponds to or may be parallel to the fourth direction DR4, other some of the light emitting elements LD may be aligned between the first electrode EL1 and the second electrode EL2 such that the length L direction thereof corresponds to or may be parallel to the fifth direction DR5, and still other some of the light emitting elements LD may be aligned between the first electrode EL1 and the second electrode EL2 such that the length L direction thereof corresponds to or may be parallel to the first direction DR1.

As described above, in the case that the first electrode EL1 and the second electrode EL2 have a shape extending in an oblique direction inclined with respect to the first direction DR1 or the second direction DR2, e.g., in the fourth direction DR4 or the fifth direction DR5, the light emitting elements LD between the first electrode EL1 and the second electrode EL2 can be aligned in various directions. A distance P between adjacent light emitting elements LD disposed between the first electrode EL1 and the second electrode EL2 can be further secured.

In the case that the first electrode EL1 and the second electrode EL2 have a bar-like shape extending in the second direction DR2, an electric field may be formed in a horizontal direction parallel to the first direction DR1 between the first electrode EL1 and the second electrode EL2. Each of the light emitting elements LD may be disposed between the first electrode EL1 and the second electrode EL2 such that the length L direction thereof may be parallel to the first direction DR1 by the electric field formed in the horizontal direction. Some of light emitting elements LD input (or supplied) to an emission area EMA of a corresponding pixel PXL may be disposed adjacent to each other to form a group according to a quantity and/or positions of the light emitting elements LD, and other some of the light emitting elements LD may form a group in a state in which they are spaced apart from each other at a certain distance. In the case that a portion of the light emitting elements LD are disposed adjacent to each other to form a group, a distance between the adjacent light emitting elements LD may not be sufficiently secured. In the case that the first contact electrode CNE1 and the second contact electrode CNE2 are formed on the light emitting elements LD, a portion of the conductive layer constituting the first and second contact electrodes CNE1 and CNE2 may remain in a minute gap between adjacent light emitting elements LD. A short-circuit defect between the first contact electrode CNE1 and the second contact electrode CNE2 may occur due to the conductive layer remaining between the adjacent light emitting elements LD. The corresponding pixel PXL does not emit light due to the short-circuit defect, and therefore, luminance imbalance for each position may occur in the display device.

In the above-described embodiment, each of the first and second electrodes EL1 and EL2 are designed to have a shape in which electrodes extending in an oblique direction inclined with respect to the second direction DR2, e.g., in the fourth direction DR4 and/or the fifth direction DR5 are alternately arranged along the second direction DR2. Thus, the light emitting elements LD between the first electrode EL1 and the second electrode EL2 can be aligned in various directions. The distance P between adjacent light emitting elements LD disposed between the first electrode EL1 and the second electrode EL2 may be sufficiently secured, so that the conductive layer constituting the first and second contact electrodes CNE1 and CNE2 does not remain between the adjacent light emitting elements LD. Accordingly, the short-circuit defect between the first contact electrode CNE1 and the second contact electrode CNE2 can be prevented.

Also, in accordance with the above-described embodiment, the second insulating layer INS2 may be designed to have a shape corresponding to the first and second electrodes EL1 and EL2, so that light emitting elements LD are stably fixed in the emission area EMA of each pixel PXL. Thus, loss of the light emitting elements LD can be reduced. Accordingly, a number of effective light emitting elements LD in the emission area EMA increases, so that the light emission efficiency of the corresponding pixel PXL can be improved.

Additionally, in accordance with the above-described embodiment, the first and second contact electrodes CNE1 and CNE2 are designed to have a shape corresponding to the first and second electrodes EL1 and EL2, so that a contact defect occurring in the case that both the end portions EP1 and EP2 of each of the light emitting elements are not in contact with a corresponding contact electrode can be prevented.

Figure 8:
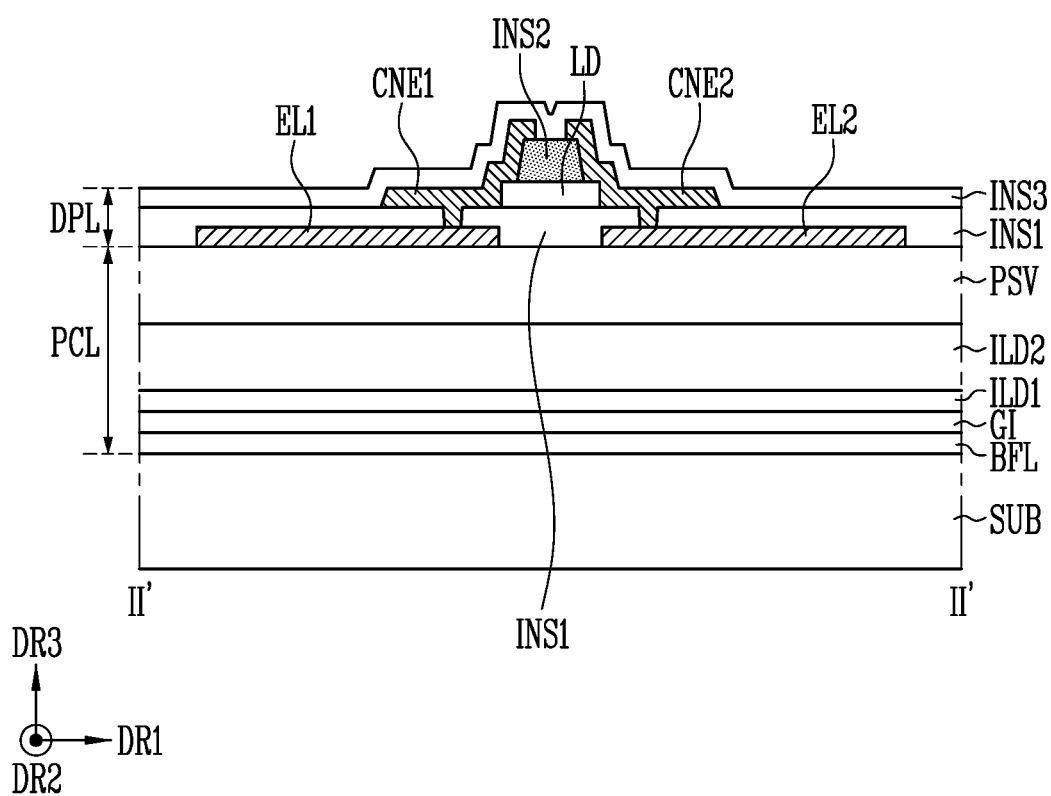
FIG. 8 is a sectional view taken along line II-II' shown in FIG. 5.
Figure 9:
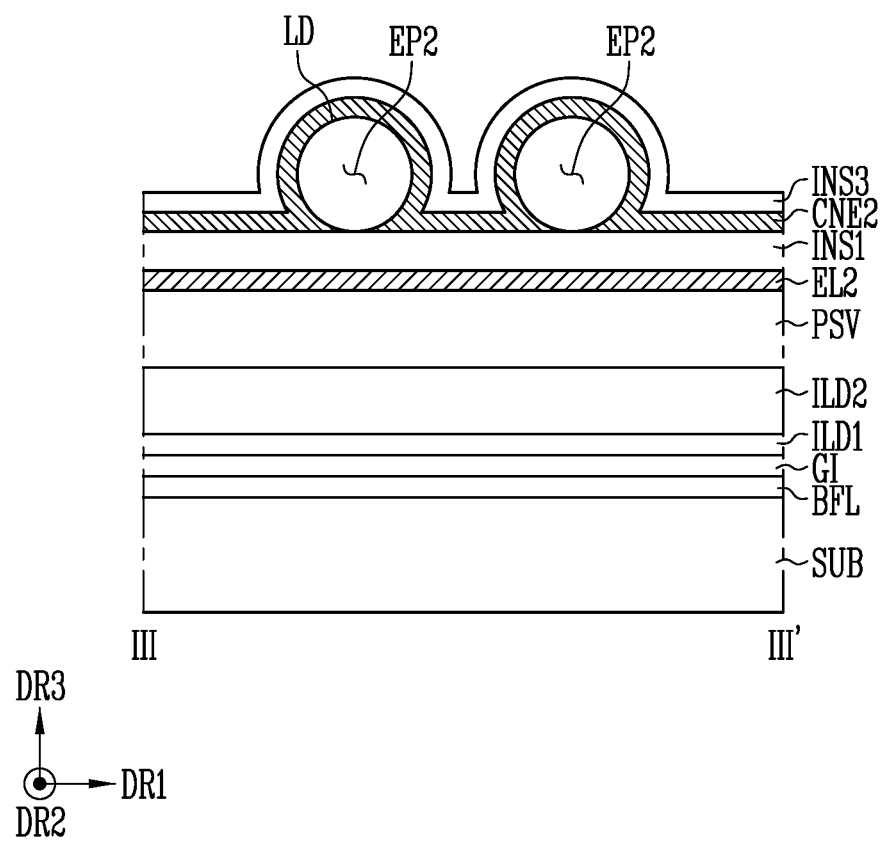
FIG. 9 is a sectional view taken along line III-III' shown in FIG. 6A.

Hereinafter, a structure of the pixel PXL in accordance with the above-described embodiment will be described along a stacking order with reference to FIGS. 7 to 9.

Figure 7:
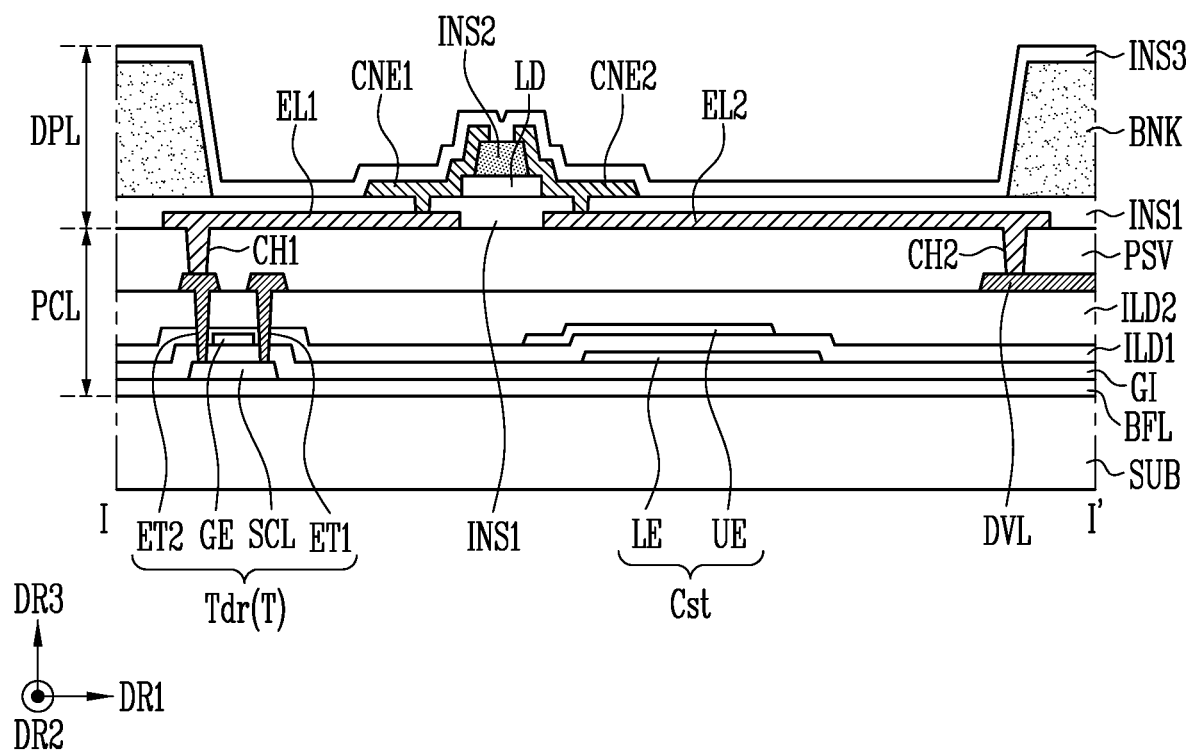
FIG. 7 is a sectional view taken along line I-I' shown in FIG. 5.

FIG. 7 is a sectional view taken along line I-I' shown in FIG. 5. FIG. 8 is a sectional view taken along line II-II' shown in FIG. 5. FIG. 9 is a sectional view taken along line III-III' shown in FIG. 5.

Referring to FIGS. 5 and 7 to 9, the pixel PXL may include a substrate SUB, a pixel circuit layer PCL, and a display element layer DPL.

The substrate SUB may include a transparent insulating material to enable light to be transmitted therethrough. The substrate SUB may be a rigid substrate or a flexible substrate.

The rigid substrate may include, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, at least one transistor T, at least one storage capacitor Cst, and a protective layer PSV.

The buffer layer BFL may prevent an impurity from being diffused into the transistor T included in the pixel circuit (see 'PXC' shown in FIG. 4). The buffer layer BFL may be an inorganic insulating layer including an inorganic material. The buffer layer BFL may include, for example, at least one of silicon nitride (SiNx), silicon oxide (SiOx), silicon oxynitride (SiON), and metal oxide such as aluminum oxide (AlOx). The buffer layer BFL may be provided as a single layer, but be provided as a multi-layer including at least two layers. In the case that the buffer layer BFL is provided as the multi-layer, the layers may be formed of the same material or be formed of different materials. The buffer layer BFL may be omitted according to the material and process conditions of the substrate SUB.

The transistor T may include a driving transistor Tdr for controlling a driving current of light emitting elements LD and a switching transistor (not shown) connected to the driving transistor Tdr. The driving transistor Tdr may be the first transistor T1 described with reference to FIG. 4, and the switching transistor may be the second transistor T2 described with reference to FIG. 4. The driving transistor Tdr and the switching transistor may have structures substantially similar or identical to each other. Therefore, a description of the switching transistor will be replaced with that of the driving transistor Tdr.

The driving transistor Tdr may include a semiconductor pattern SCL, a gate electrode GE, a first terminal ET1, and a second terminal ET2. The first terminal ET1 may be any one of a source electrode and a drain electrode, and the second terminal ET2 may be the other of the source electrode and the drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap with the gate electrode GE of the corresponding transistor T. The transistor semiconductor pattern SCL may be made of poly-silicon, amorphous silicon, oxide semiconductor, etc. The channel region may be a semiconductor pattern undoped with an impurity, and may be an intrinsic semiconductor. Each of the first contact region and the second contact region may be a semiconductor pattern doped with the impurity.

The gate electrode GE may be provided and/or formed on a gate insulating layer GI to correspond to the channel region of the semiconductor pattern SCL. The gate electrode GE may be provided on the gate insulating layer GI to overlap with the channel region of the semiconductor pattern SCL. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which may be a low-resistance material so as to decrease wiring resistance.

The gate insulating layer GI may be an inorganic insulating layer including an inorganic material. In an example, the gate insulating layer GI may include at least one of silicon nitride (SiNx), silicon oxide (SiOx), silicon oxynitride (SiON), and metal oxide such as aluminum oxide (AlOx). However, the material of the gate insulating layer GI is not limited to the above-described embodiments. In some embodiments, the gate insulating layer GI may be an organic insulating layer including an organic material. The gate insulating layer GI may be provided as a single layer, but be provided as a multi-layer including at least two layers.

The first terminal ET1 and the second terminal ET2 may be provided and/or formed on a second interlayer insulating layer ILD2, and be respectively in contact with the first contact region and the second contact region of the semiconductor pattern SCL through contact holes sequentially penetrating a first interlayer insulating layer ILD1 and the second interlayer insulating layer ILD2. In an example, the first terminal ET1 may be in contact with the first contact region of the semiconductor pattern SCL, and the second terminal ET2 may be in contact with the second contact region of the semiconductor pattern SCL. Each of the first and second terminals ET1 and ET2 may include the same material as the gate electrode GE or include at least one selected from the materials exemplified as the material constituting the gate electrode GE.

The first interlayer insulating layer ILD1 may include the same material as the gate insulating layer GI or include at least one selected from the materials exemplified as the material constituting the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. In some embodiments, the second interlayer insulating layer ILD2 may include the same material as the first interlayer insulating layer ILD1, but the disclosure is not limited thereto. The second interlayer insulating layer ILD2 may be provided as a single layer, but be provided as a multi-layer including at least two layers.

Although a case where the first and second terminals ET1 and ET2 of the transistor T are separate electrodes electrically connected to the semiconductor pattern SCL through contact holes sequentially penetrating the gate insulating layer GI and the first and second interlayer insulating layers ILD1 and ILD2 has been described in the above-described embodiment, the disclosure is not limited thereto. In some embodiments, the first terminal ET1 of the transistor T may be the first contact region adjacent to the channel region of the corresponding semiconductor pattern SCL, and the second terminal ET2 of the transistor T may be the second contact region adjacent to the channel region of the corresponding semiconductor pattern SCL. The second terminal ET2 of the transistor T may be electrically connected to the light emitting elements LD of the corresponding pixel PXL through a separate connection means such as a bridge electrode.

In an embodiment of the disclosure, the transistors T may be implemented with a low temperature polycrystalline silicon (LTPS) thin film transistor, but the disclosure is not limited thereto. In some embodiments, the transistors T may be implemented with an oxide semiconductor thin film transistor. Also, although a case where the transistors T are implemented with a thin film transistor having a top gate structure has been described in the above-described embodiment, the disclosure is not limited thereto, and the structure of the transistors T may be variously modified.

The storage capacitor Cst may include a lower electrode LE provided on the gate insulating layer GI and an upper electrode UE provided on the first interlayer insulating layer ILD1 to overlap with the lower electrode LE.

The lower electrode LE may be provided in the same layer as the gate electrode GE of the driving transistor Tdr, and include the same material as the gate electrode GE of the driving transistor Tdr. The lower electrode LE may be integrally provided with the gate electrode GE of the driving transistor Tdr. The lower electrode LE may be considered as one region of the driving transistor Tdr. In some embodiments, the lower electrode LE may be provided as a component separately from (or non-integrally with) the gate electrode GE of the driving transistor Tdr. The lower electrode LE and the gate electrode GE of the driving transistor Tdr may be electrically connected to each other through a separate connection means.

The upper electrode UE may overlap with the lower electrode LE, and cover the lower electrode LE. The overlapping area of the upper electrode UE and the lower electrode LE are widened, so that the capacitance of the storage capacitor Cst can be increased. The upper electrode UE may be electrically connected to a first power line (see 'PL1' shown in FIG. 4). The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may be the same component as the second power line PL2 described with reference to FIG. 4. Accordingly, a voltage of the second driving power source VSS may be applied to the driving voltage line DVL. The pixel circuit layer PCL may further include the first power line PL1 electrically connected to the first driving power source VDD. Although not directly shown in the drawings, the first power line PL1 may be provided in the same layer as the driving voltage line DVL or be provided in a layer different from that of the driving voltage line DVL. Although a case where the driving voltage line may be provided in the same layer as the first and second electrodes ET1 and ET2 of the transistors T has been described in the above-described embodiment, the disclosure is not limited thereto. In some embodiments, the driving voltage line DVL may be provided in the same layer as any one conductive layer among the conductive layers provided in the pixel circuit layer PCL. For example, the position of the driving voltage line DVL in the pixel circuit layer PCL may be variously changed.

Each of the first power line PL1 and the driving voltage line DVL may include a conductive material (or substance). In an example, each of the first power line PL1 and the driving voltage line DVL may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which may be a low-resistance material so as to decrease wiring resistance. In an example, each of the first power line PL1 and the driving voltage line DVL may be configured as a double layer in which titanium (Ti)/copper (Cu) are sequentially stacked.

The first power line PL1 may be electrically connected to one component, e.g., a first electrode EL1 of the display element layer DPL, and the driving voltage line DVL may be electrically connected to another component, e.g., a second electrode EL2 of the display element layer DPL.

The protective layer PSV may be provided and/or formed over the transistors T and the driving voltage line DVL.

The protective layer PSV may be provided in a form including an organic insulating layer, an inorganic insulating layer, or the organic insulating layer disposed on the inorganic insulating layer. The inorganic insulating layer may include, for example, at least one of silicon oxide (SiOx), silicon nitride (SiNx), silicon oxynitride (SiON), and metal oxide such as aluminum oxide (AlOx). For example, the organic insulating layer may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The protective layer PSV may include a first contact hole CH1 exposing the second terminal ET2 of the driving transistor Tdr and a second contact hole CH2 exposing the driving voltage line DVL.

The display element layer DPL may be provided on the protective layer PSV.

The display element layer DPL may include a bank BNK, the first and second electrodes EL1 and EL2, light emitting elements LD, first and second contact electrodes CNE1 and CNE2, and first to third insulating layers INS1 to INS3.

The bank BNK may be provided and/or formed on the first insulating layer INS1, and define (or partition) an emission area EMA of a corresponding pixel PXL. The bank BNK may include a first opening OP1 and a second opening OP2 spaced apart from the first opening OP1. The second opening OP2 of the bank BNK may correspond to the emission area EMA of each of the pixels PXL.

The first electrode EL1 and the second electrode EL2 may be disposed to be spaced apart from each other along the first direction DR1. An end portion of the first electrode EL1 may be located in the first opening OP1 of the bank BNK. The first electrode EL1 may be separated from a first electrode (not shown) provided in another electrode (e.g., a first electrode (not shown) provided in adjacent pixels PXL adjacent to each other in the second direction DR2) in the first opening after light emitting elements LD are supplied and arranged in the emission area EMA of the corresponding pixel PXL in a manufacturing process of the display device. The first opening OP1 of the bank BNK may be provided for the purpose of a separation process for the first electrode EL1.

Although a case where only the first electrode EL1 may be separated from another electrode in the first opening OP1 of the bank BNK has been described in the above-described embodiment, the disclosure is not limited thereto. In some embodiments, the second electrode EL2 may also be separated from another electrode (e.g., a second electrode (not shown) provided in adjacent pixels PXL adjacent in the second direction DR2) in the first opening OP1 of the bank BNK. The first opening OP1 of the bank BNK may be provided for the purpose of a separation process for the first electrode EL1 and the second electrode EL2.

Each of the first electrode EL1 and the second electrode EL2 may be made of a material having a constant reflexibility so as to allow light emitted from each of the light emitting elements LD to advance in an image display direction (or front direction) of the display device. In an example, each of the first electrode EL1 and the second electrode EL2 may be made of a conductive material (or substance) having a constant reflexibility. The conductive material (or substance) may include an opaque metal advantageous in reflecting lights emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the first electrode EL1 and the second electrode EL2 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like. In the case that each of the first electrode EL1 and the second electrode EL2 includes the transparent conductive material, a separate conductive layer may be additionally included, which may be made of an opaque metal for reflecting lights emitted from the light emitting elements LD in the image display direction of the display device. However, the material of each of the first electrode EL1 and the second electrode EL2 is not limited to the above-described materials.

Also, each of the first electrode EL1 and the second electrode EL2 may be provided and/or formed as a single layer, but the disclosure is not limited thereto. In some embodiments, each of the first electrode EL1 and the second electrode EL2 may be provided and/or formed as a multi-layer in which two or more materials among metals, alloys, conductive oxides, and conductive polymers are stacked. Each of the first electrode EL1 and the second electrode EL2 may be provided as a multi-layer including at least two layers so as to minimize distortion caused by a signal delay in the case that a signal (or voltage) is transferred to both end portions (see 'EP1 and EP2' shown in FIG. 6A) of each of the light emitting elements LD. In an example, each of the first electrode EL1 and the second electrode EL2 may be provided as a multi-layer in which indium tin oxide (ITO)/silver (Ag)/indium tin oxide (ITO) are sequentially stacked.

The first electrode EL1 may be electrically connected to the driving transistor Tdr of the pixel circuit layer PCL through the first contact hole CH1, and the second electrode EL2 may be electrically connected to the driving voltage line DVL of the pixel circuit layer PCL through the second contact hole CH2 of the protective layer PSV.

The first insulating layer INS1 may be provided and/or formed over the first electrode EL1 and the second electrode EL2.

The first insulating layer INS1 may include an inorganic insulating layer made of an inorganic material or an organic insulating layer made of an organic material. The first insulating layer INS1 may be configured as an inorganic insulating layer advantageous in protecting the light emitting elements LD from the pixel circuit layer PCL of each pixel PXL. In an example, the first insulating layer INS1 may include at least one of silicon oxide (SiOx), silicon nitride (SiNx), silicon oxynitride (SiON), and metal oxide such as aluminum oxide (AlOx), but the disclosure is not limited thereto. In some embodiments, the first insulating layer INS1 may be configured as an organic insulating layer advantageous in planarizing a supporting surface of the light emitting elements LD.

The first insulating layer INS1 may be provided and/or formed on the protective layer PSV to entirely cover the first electrode EL1 and the second electrode EL2. After light emitting elements LD are supplied and aligned on the first insulating layer INS1, the first insulating layer INS1 may be partially opened to expose one region of each of the first and second electrodes EL1 and EL2 as shown in FIGS. 7 and 8. The first insulating layer INS1 may be patterned in the shape of an individual pattern locally disposed on the bottom of the light emitting elements LD after the light emitting elements are supplied and aligned. The first insulating layer INS1 may cover the other regions except the one region of each of the first and second electrodes EL1 and EL2. In some embodiments, the first insulating layer INS1 may be omitted.

The bank BNK may be provided and/or formed on the first insulating layer INS1. The bank BNK may be formed between other pixels PXL to surround the emission area EMA of each pixel PXL. Therefore, the bank BNK may constitute a pixel defining layer partitioning the emission area EMA of the corresponding pixel PXL. The bank BNK may serve as a dam structure which prevent a solution in which light emitting elements LD are mixed from being introduced to an emission area EMA of an adjacent pixel PXL or controls a constant amount of solution to be supplied to each emission area EMA, in a process of forming the light emitting elements LD to the emission area EMA.

Light emitting elements LD may be supplied and aligned in the emission area EMA of each pixel PXL, in which the first insulating layer INS1 may be formed. In an example, the light emitting elements LD are supplied (or input) to the emission area EMA through an inkjet process or the like, and be aligned between the first electrode EL1 and the second electrode EL2 by a predetermined alignment voltage (or alignment signal) applied to each of the first electrode EL1 and the second electrode EL2.

The second insulating layer INS2 may be provided and/or formed on the light emitting elements LD. The second insulating layer INS2 may be provided and/or formed on light emitting elements LD aligned between the first electrode EL1 and the second electrode EL2 to partially cover an outer circumferential surface (or surface) of each of the light emitting elements LD, and expose both end portions EP1 and EP2 of each of the light emitting elements LD to the outside.

The first and second contact electrodes CNE1 and CNE2 may be components which stably connect the first and second electrodes EL1 and EL2 and the light emitting elements LD.

The first contact electrode CNE1 may be provided and/or formed on one end portion of each of the first electrode EL1 and the light emitting elements LD. The first contact electrode CNE1 may be disposed to be in contact with the first electrode EL1 on one region of the first electrode EL1, which may not be covered by the first insulating layer INS1. In some embodiments, in the case of a conductive capping layer (not shown) is disposed on the first electrode EL1, the first contact electrode CNE1 may be disposed on the conductive capping layer to be connected to the first electrode EL1 through the conductive capping layer. The conductive capping layer may protect the first electrode EL1 from a failure occurring in a manufacturing process of the display device, and further reinforce adhesion between the first electrode EL1 and the pixel circuit layer PCL located on the bottom thereof. The conductive capping layer may include a transparent conductive material (or substance) such as indium zinc oxide (IZO).

Also, the first contact electrode CNE1 may be disposed on a first end portion EP1 of each of light emitting elements LD adjacent to the first electrode EL1 to be in contact with the first end portion of each of the light emitting elements LD. For example, the first contact electrode CNE1 may be disposed to cover the first end portion EP1 of each of the light emitting elements LD and at least one region of the first electrode EL1, which corresponds thereto.

The second contact electrode CNE2 may be provided and/or formed on the second electrode EL2 and a second end portion EP2 of each of the light emitting elements LD. The second contact electrode CNE2 may be disposed on one region of the second electrode EL2, which may not be covered by the first insulating layer INS1, to be in contact with the second electrode EL2. In some embodiments, in the case of a conductive capping layer is disposed on the second electrode EL2, the second contact electrode CNE2 may be disposed on the conductive capping layer to be connected to the second electrode EL2 through the conductive capping layer.

Also, the second contact electrode CNE2 may be disposed on a second end portion EP2 of each of light emitting elements LD adjacent to the second electrode EL2 to be in contact with the second end portion EP2 of each of the light emitting elements LD. For example, the second contact electrode CNE2 may be disposed to cover the second end portion of each of the light emitting elements LD and at least one region of the second electrode EL2, which corresponds thereto.

The first and second contact electrodes CNE1 and CNE2 may be made of various transparent conductive materials (or substances) so as to allow light which may be emitted from each of the light emitting elements LD and then reflected by the first and second electrodes EL1 and EL2 to advance in the image display direction of the display device without loss of light. In an example, the first and second contact electrodes CNE1 and CNE2 may include at least one of various transparent conductive materials (or substances) including indium tin oxide (ITO), indium zinc oxide (IZO), zinc oxide (ZnO), indium gallium zinc oxide (IGZO), and indium tin zinc oxide (ITZO), and be substantially transparent or translucent to satisfy a predetermined transmittance (or transmittancy). However, the material of the first and second contact electrodes CNE1 and CNE2 is not limited to the above-described embodiment. In some embodiments, the first and second contact electrodes CNE1 and CNE2 may be made of various opaque conductive materials. The first and second contact electrodes CNE1 and CNE2 may be formed as a single layer or a multi-layer.

The first contact electrode CNE1 and the second contact electrode CNE2 may be provided in the same layer. The first contact electrode CNE1 and the second contact electrode CNE2 may be formed by using the same material in the same process, but the disclosure is not limited thereto. In some embodiments, the first contact electrode CNE1 and the second contact electrode CNE2 may be formed through different processes to be provided in different layers. This will be described later with reference to FIGS. 14 and 15.

The third insulating layer INS3 may be provided and/or formed over the first contact electrode CNE1 and the second contact electrode CNE2. The third insulating layer INS3 may be an inorganic insulating layer including an inorganic material or an organic insulating layer including an organic material. In an example, the third insulating layer INS3 may have a structure in which at least one inorganic insulating layer and at least one organic insulating layer are alternately stacked. The third insulating layer INS3 may entirely cover the display element layer DPL to block moisture, humidity or the like from the outside from being introduced to the display element layer DPL including the light emitting elements LD.

In some embodiments, the display element layer DPL may selectively further include an optical layer in addition to the third insulating layer. In an example, the display element layer DPL may further include a color conversion layer including color conversion particles for converting light emitted from the light emitting elements LD into light of a specific color.

In other embodiments, at least one overcoat layer (e.g., a layer planarizing a top surface of the display element layer DPL) may be further disposed on the top of the third insulating layer INS3.

Figure 10:
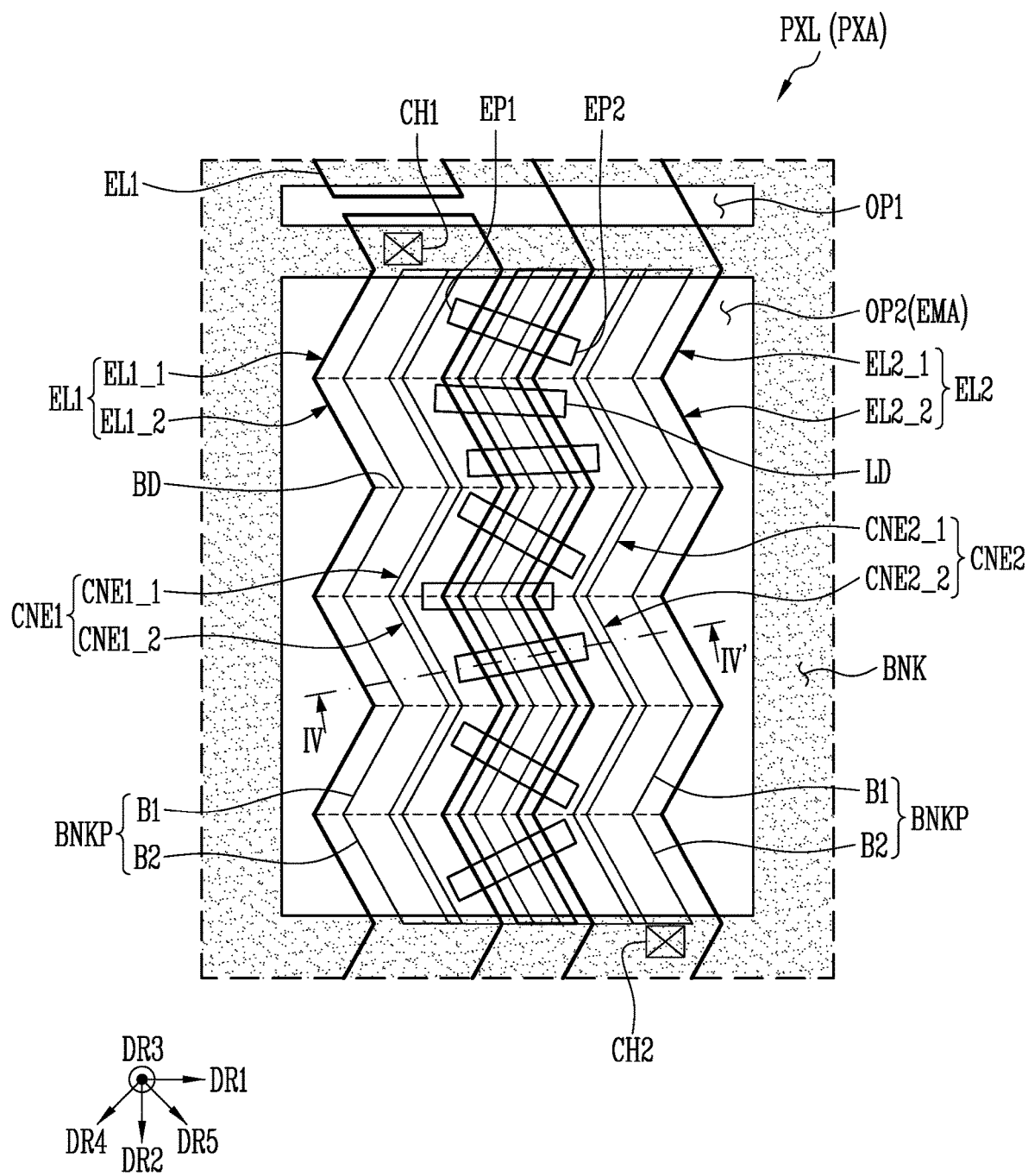
FIG. 10 is a schematic plan view illustrating a pixel in accordance with another embodiment of the disclosure.
Figure 11:
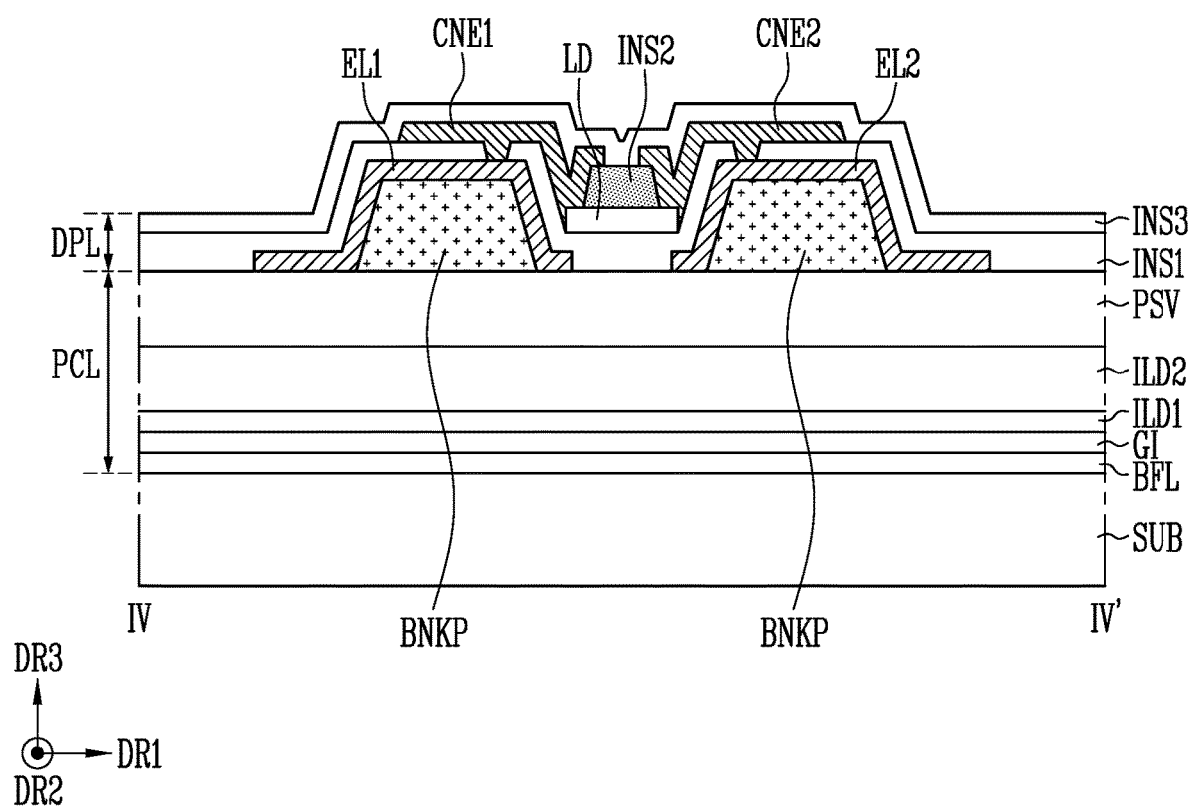
FIG. 11 is a sectional view taken along line IV-IV' shown in FIG. 10.
Figure 12:
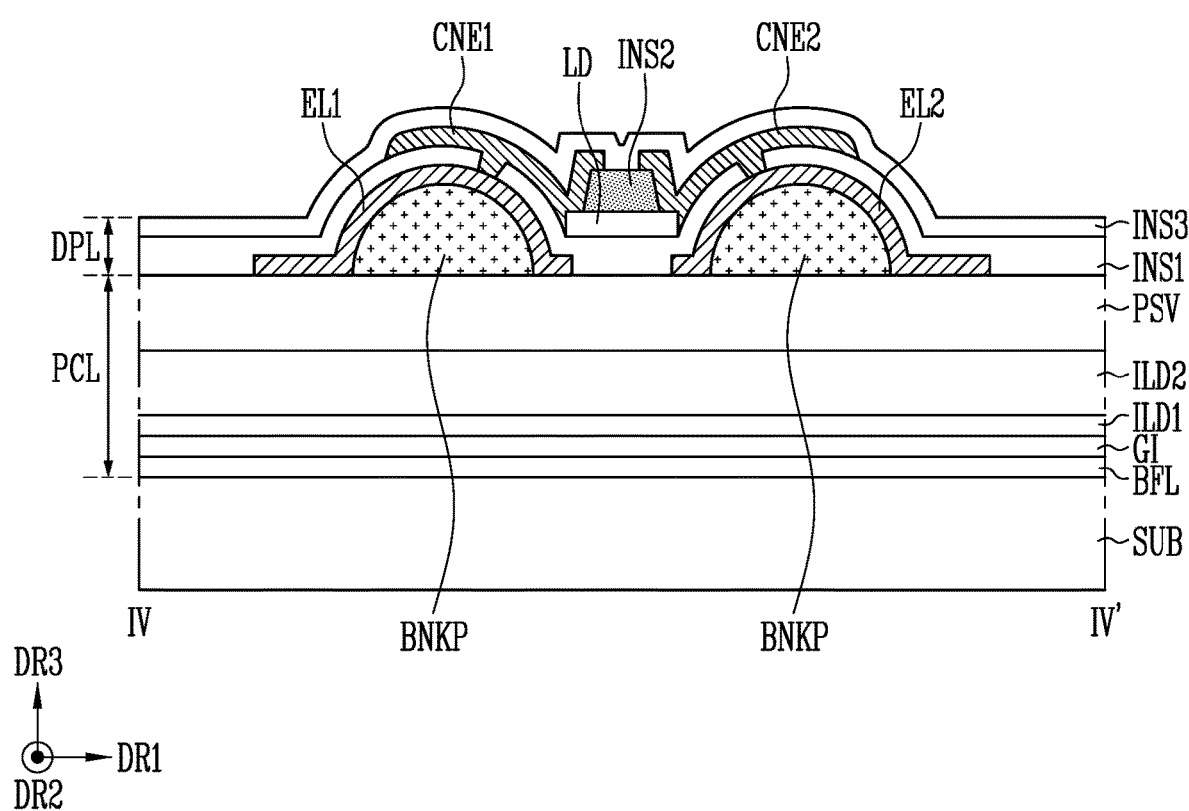
FIG. 12 illustrates another embodiment of a bank pattern shown in FIG. 10 and is a sectional view taken along the line IV-IV' shown in FIG. 10.
Figure 13:
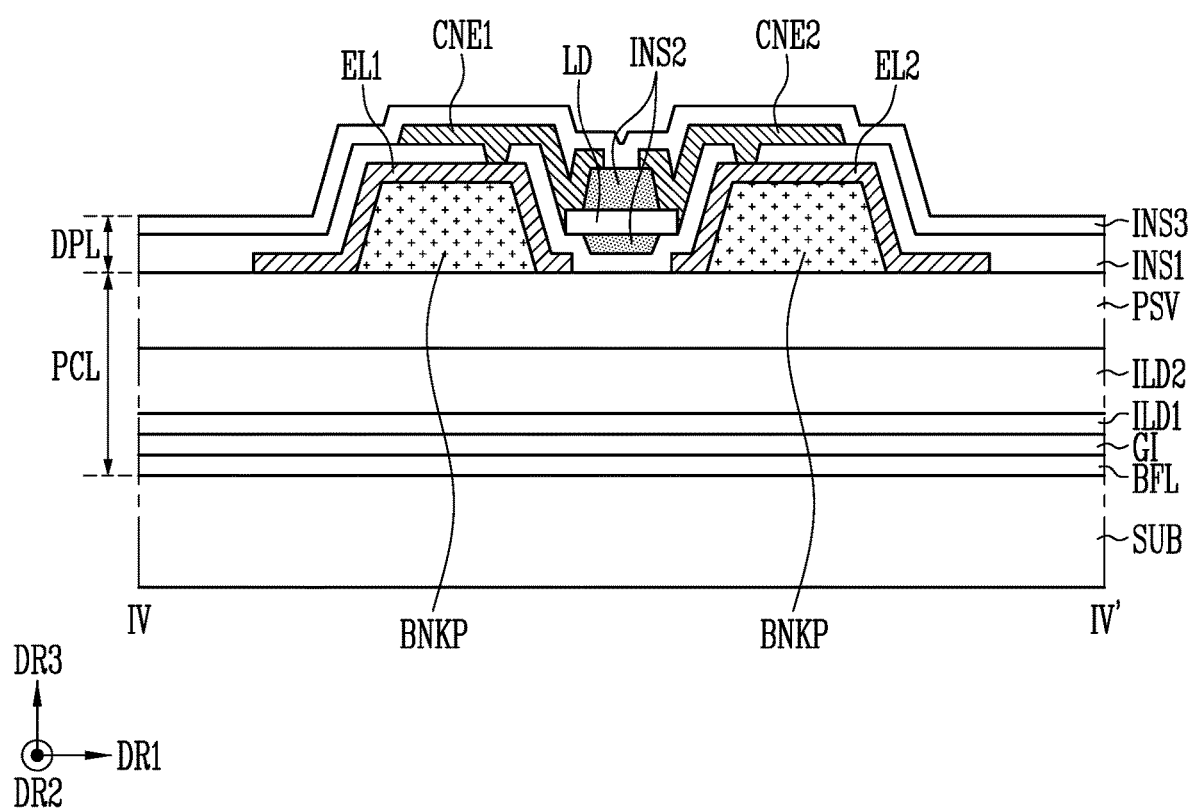
FIG. 13 illustrates another embodiment of first and second contact electrodes shown in FIG. 10 and is a sectional view taken along the line IV-IV' shown in FIG. 10.

FIG. 10 is a plan view schematically illustrating a pixel in accordance with another embodiment of the disclosure. FIG. 11 is a sectional view taken along line IV-IV' shown in FIG. 10. FIG. 12 illustrates another embodiment of a bank pattern shown in FIG. 10 and is a sectional view taken along the line IV-IV' shown in FIG. 10. FIG. 13 illustrates another embodiment of first and second contact electrodes shown in FIG. 10 and is a sectional view taken along the line IV-IV' shown in FIG. 10.

The pixel shown in FIGS. 10 to 13 may have a configuration substantially identical or similar to that of the pixel shown in FIGS. 5 to 9, in that a bank pattern BNKP may be disposed between the protective layer PSV and each of the first and second electrodes EL1 and EL2.

Accordingly, in relation to the pixel shown in FIGS. 10 to 13, portions different from those of the above-described embodiment will be described to avoid redundancy.

Referring to FIGS. 10 to 13, a supporting member may be located between each of the first and second electrodes EL1 and EL2 and the protective layer PSV. In an example, as shown in FIGS. 11 to 13, the bank pattern BNKP may be located between each of the first and second electrodes EL1 and EL2 and the protective layer PSV.

The bank pattern BNKP may be located in an emission area EMA in which light may be emitted in a pixel area PXA of each pixel PXL. The bank pattern BNKP may be a supporting member which supports each of the first and second electrodes EL1 and EL2 to change a surface profile (or shape) of each of the first and second electrodes EL1 and EL2 such that light emitted from light emitting elements LD may be guided in the image display direction of the display device.

The bank pattern BNKP may be provided between the protective layer PSV and each of the first and second electrodes EL1 and EL2 in an emission area EMA of a corresponding pixel PXL.

The bank pattern BNKP may be an inorganic insulating layer including an inorganic material or an organic insulating layer including an organic material. In some embodiments, the bank pattern BNKP may include a single-layered organic insulating layer and/or a single-layered inorganic insulating layer, but the disclosure is not limited thereto. In some embodiments, the bank pattern BNKP may be provided in the form of a multi-layer in which at least one organic insulating layer and at least one inorganic insulating layer are stacked. However, the material of the bank pattern BNKP is not limited to the above-described embodiment. In some embodiments, the bank pattern BNKP may include a conductive material.

The bank pattern BNKP may have a section having a trapezoidal shape of which width become narrower as approaching toward the top along the third direction DR3 from one surface (e.g., an upper surface) of the protective layer PSV, but the disclosure is not limited thereto. In some embodiments, as shown in FIG. 12, the bank pattern BNKP may include a curved surface having a section such as a semi-elliptical shape or a semicircular shape (or hemispherical shape), of which width becomes narrower as approaching the top along the third direction DR3 from the one surface of the protective layer PSV. In the case that viewed on a section, the shape of the bank pattern BNKP is not limited to the above-described embodiments, and may be variously modified within a range in which the efficiency of light emitted from each of the light emitting elements LD can be improved.

The bank pattern BNKP may be designed to have a shape corresponding to that of the first and second electrodes EL1 and EL2. In an example, the bank pattern BNKP (hereinafter, referred to as a 'first bank pattern') located between the first electrode EL1 and the protective layer PSV may be designed to have a shape corresponding to that of the first electrode EL1 located on the top thereof, and the bank pattern BNKP (hereinafter, referred to as a 'second bank pattern') located between the second electrode EL2 and the protective layer PSV may be designed to have a shape corresponding to that of the second electrode EL2 located on the top thereof.

The first bank pattern BNKP may include a first area B1 extending in the fourth direction DR4 (e.g., an oblique direction inclined with respect to the first direction DR1 (or horizontal direction) and/or the second direction DR2 (or vertical direction)) and a second area B2 extending the fifth direction DR5 intersecting the fourth direction DR4. The first area B1 and the second B2 may be alternately arranged along the second direction DR2. The first bank pattern BNKP may have a zigzag shape in a plan view. The second bank pattern BNKP may include a first area B1 extending in the fourth direction DR4 and a second area B2 extending in the fifth direction DR5 intersecting the fourth direction DR4. The first area B1 and the second area B2 may be alternately arranged along the second direction DR2. The second bank pattern BNKP may have a zigzag shape in a plan view.

The first bank pattern BNKP and the second bank pattern BNKP may form a bilateral symmetry along the second direction DR2 in the emission area EMA of each pixel PXL.

Each of the first and second electrodes EL1 and EL2 may be provided and/or formed over a corresponding bank pattern BNKP. Each of the first and second electrodes EL1 and EL2 may have a surface profile corresponding to the shape of the bank pattern BNKP disposed on the bottom thereof. Accordingly, light emitted from the light emitting elements LD may be reflected by each of the first and second electrodes EL1 and EL2, to further advance in the image display direction of the display device. The bank pattern BNKP and each of the first and second electrodes EL1 and EL2 may be used as a reflective member which guides light emitted from the light emitting elements LD in a desired direction, thereby improving the light efficiency of the display device. Accordingly, the light emission efficiency of the light emitting elements LD can be further improved.

The second insulating layer INS2 may be provided and/or formed over each of the light emitting elements LD.

In an embodiment, the second insulating layer INS2 may be formed on light emitting elements LD after the supply and alignment of the light emitting elements LD in the emission area EMA of each of the pixels PXL may be completed, so that the light emitting elements LD can be prevented from be separated from positions at which the light emitting elements LD are aligned. As shown in FIG. 13, in the case that an empty gap (or space) exists between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured as an organic insulating layer advantageous in filling an empty gap between the first insulating layer INS1 and the light emitting elements LD.

Figure 14:
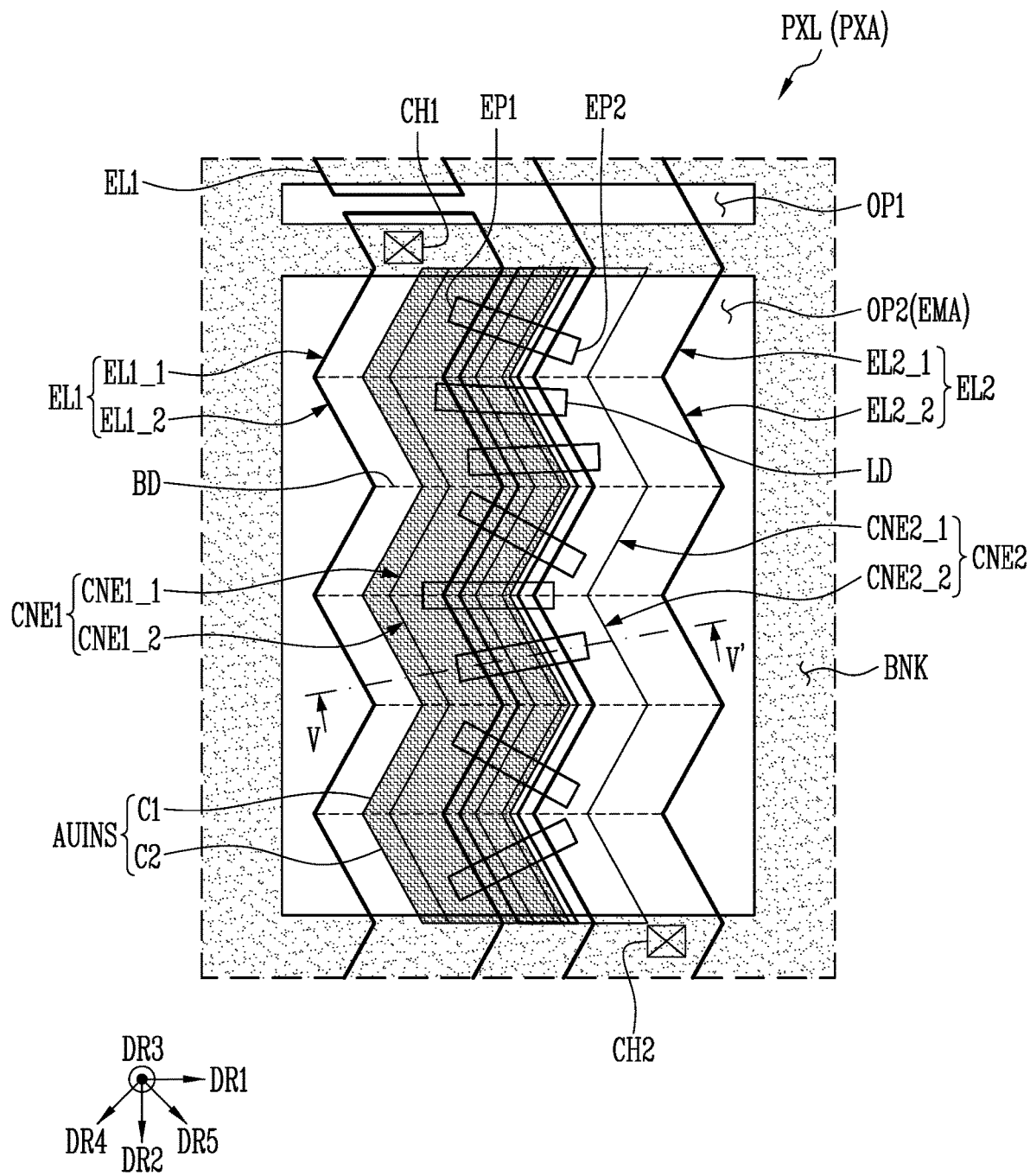
FIG. 14 is a plan view schematically illustrating a pixel in accordance with still another embodiment of the disclosure.
Figure 15:
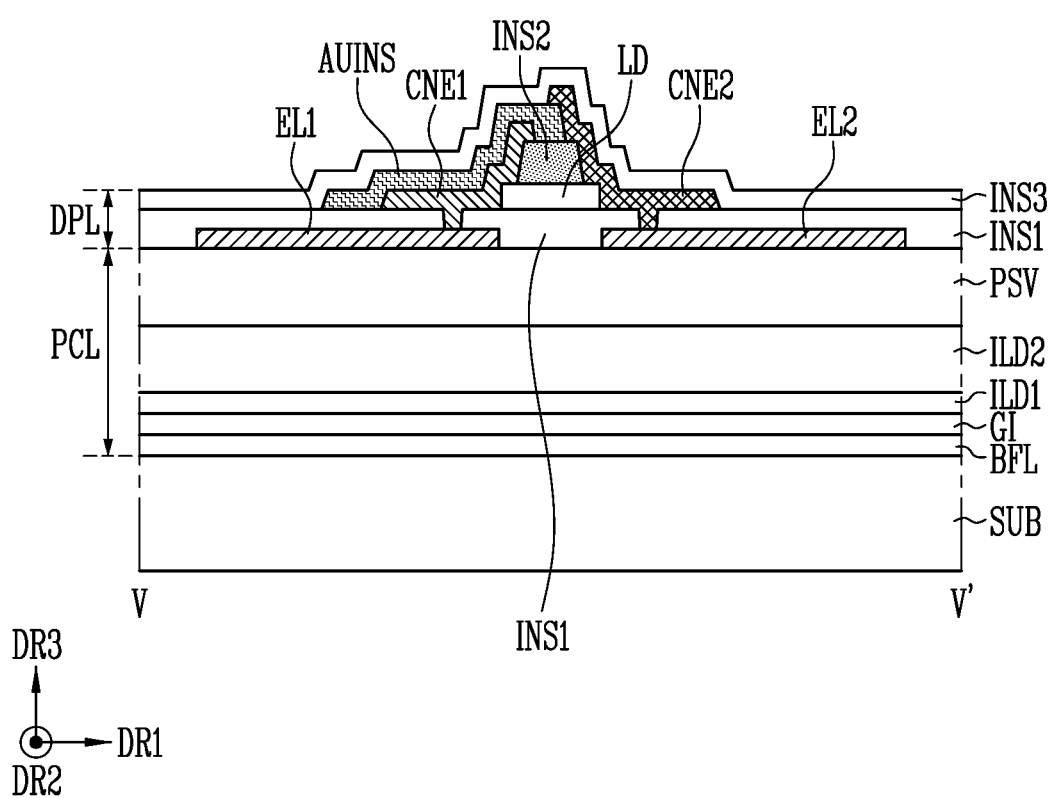
FIG. 15 is a sectional view taken along line V-V' shown in FIG. 14.

FIG. 14 is a plan view schematically illustrating a pixel in accordance with still another embodiment of the disclosure. FIG. 15 is a sectional view taken along line V-V' shown in FIG. 14.

The pixel shown in FIGS. 14 and 15 may have a configuration substantially identical or similar to that of the pixel shown in FIGS. 5 to 9, in that the first contact electrode CNE1 and the second contact electrode CNE2 are formed in different layers.

Accordingly, in relation to the pixel shown in FIGS. 14 and 15, portions different from those of the above-described embodiment will be described to avoid redundancy.

Referring to FIGS. 14 and 15, an auxiliary insulating layer AUINS may be provided and/or formed between the first contact electrode CNE1 and the second contact electrode CNE2.

The first contact electrode CNE1 may be respectively provided and/or formed on the first electrode EL1 exposed by the first insulating layer INS1, the first end portion EP1 of each of the light emitting elements LD, and the second insulating layer INS2. The first contact electrode CNE1 may be made of various transparent conductive materials such that light emitted from each of the light emitting elements LD and then reflected by the first electrode EL1 advances in the image display direction of the display device without loss. The auxiliary insulating layer AUINS may be entirely provided and/or formed over the first contact electrode CNE1.

The auxiliary insulating layer AUINS may be provided over the first contact electrode CNE1 to allow the first contact electrode CNE1 not to be exposed to the outside, thereby preventing corrosion of the first contact electrode CNE1. The auxiliary insulating layer AUINS may include an inorganic insulating layer made of an inorganic material or an organic insulating layer made of an organic material. In an example, the auxiliary insulating layer AUINS may include at least one of silicon oxide (SiOx), silicon nitride (SiNx), silicon oxynitride (SiON), and metal oxide such as aluminum oxide (AlOx), but the disclosure is not limited thereto. Also, the auxiliary insulating layer AUINS may be formed as a single layer or a multi-layer.

The auxiliary insulating layer AUINS may be designed to have a size (or area) relatively larger than that of the first contact electrode CNE1 so as to sufficiently cover the first contact electrode CNE1 while having a shape corresponding to that of the first contact electrode CNE1 located on the bottom thereof.

The auxiliary insulating layer AUINS may be designed to include a first area C1 extending in the fourth direction DR4 corresponding to an oblique direction inclined with respect to the first direction DR1 (or horizontal direction) and/or the second direction DR2 (or vertical direction) and a second area C2 extending in the fifth direction DR5 intersecting the fourth direction DR4. The first area C1 of the auxiliary insulating layer AUINS may be designed to have a size (or area) relatively larger than that of the (1-1)th contact electrode CNE1_1 of the first contact electrode CNE1. Thus, the first area C1 of the auxiliary insulating layer AUINS can completely cover the (1-1)th contact electrode CNE1_1. The second area C2 of the auxiliary insulating layer AUINS may be designed to have a size (or area) relatively larger than that of the (1-2)th contact electrode CNE1_2 of the first contact electrode CNE1. Thus, the second area C2 of the auxiliary insulating layer AUINS can completely cover the (1-2)th contact electrode CNE1_2.

The auxiliary insulating layer AUINS may have a zigzag form including a straight line having a predetermined inclination in a plan view. The first area C1 and the second area C2 may be alternately arranged along the second direction DR2. The second contact electrode CNE2 may be provided and/or formed on the auxiliary insulating layer AUINS.

The second contact electrode CNE2 may be respectively provided and/or formed on the auxiliary insulating layer AUINS, the second electrode EL2 exposed by the first insulating layer INS1, and the second end portion EP2 of each of the light emitting elements LD. The second contact electrode CNE2 may be made of a transparent conductive material. The second contact electrode CNE2 may include the same material as the first contact electrode CNE1, but the disclosure is not limited thereto.

The third insulating layer INS3 covering the second contact electrode CNE2 may be provided and/or formed over the second contact electrode CNE2. The third insulating layer INS3 may include a thin film encapsulation layer including at least one inorganic layer and/or at least one organic layer, but the disclosure is not limited thereto. In some embodiments, at least one overcoat layer (e.g., a layer planarizing the top surface of the display element layer DPL) may be further disposed on the top of the third insulating layer INS3.

In the pixel and the display device including the same in accordance with the disclosure, light emitting elements between two adjacent electrodes may be efficiently aligned, so that light emission efficiency can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims including equivalents thereof.

What is claimed is:

1. A pixel comprising:
a first electrode and a second electrode that are spaced apart from each other in a first direction, the first electrode and the second electrode each extending in a second direction intersecting the first direction; and
light emitting elements disposed between the first electrode and the second electrode, wherein
the first electrode includes:
at least one (1-1) th electrode extending in a third direction inclined with respect to one of the first and second directions; and
at least one (1-2) th electrode extending in a fourth direction intersecting the third direction,
the second electrode includes:
at least one (2-1) th electrode extending in the third direction; and
at least one (2-2) th electrode extending in the fourth direction,
the at least one (1-1) th electrode and the at least one (2-1) th electrode correspond to each other in the first direction,
the at least one (1-2) th electrode and the at least one (2-2) th electrode correspond to each other in the first direction,
one of the at least one (1-2) th electrode directly contacts a first end of one of the at least (1-1) th electrode and another one of the at least one (1-2) th electrode directly contacts a second and opposite end of the one of the at least one (1-1) th electrode, and
one of the at least one (2-2) th electrode directly contacts a first end of one of the at least one (2-1) th electrode and another one of the at least one (2-2) th electrode directly contacts a second and opposite end of the one of the at least one (2-1) th electrode.

2. The pixel of claim 1, further comprising a bank surrounding the light emitting elements along a periphery of the light emitting elements in a plan view, the bank including at least one opening, wherein
the at least one opening corresponds to an emission area in which light is emitted in each of the light emitting elements, and
the first electrode and the second electrode have a same planar shape in the emission area.

3. The pixel of claim 2, wherein
the at least one (1-1) th electrode and the at least one (2-1) th electrode have a same planar shape, and
the at least one (1-2) th electrode and the at least one (2-2) th electrode have a same planar shape.

4. The pixel of claim 3, wherein
the at least one (1-1) th electrode and the at least one (1-2) th electrode form a mirror symmetry with respect to a boundary between the at least one (1-1) th electrode and the at least one (1-2) th electrode, and
the at least one (2-1) th electrode and the at least one (2-2) th electrode form a mirror symmetry with respect to a boundary between the at least one (2-1) th electrode and the at least one (2-2) th electrode.

5. The pixel of claim 3, wherein a width of each of the at least one (1-1) th electrode, the at least one (1-2) th electrode, the at least one (2-1) th electrode, and the at least one (2-2) th electrode in the second direction is smaller than a length of each of the light emitting elements.

6. The pixel of claim 3, wherein
each of the at least one (1-1) th electrode and the at least one (2-1) th electrode has a polygonal shape having an inclination corresponding to the third direction in a plan view, and
each of the at least one (1-2) th electrode and the at least one (2-2) th electrode has a polygonal shape having an inclination corresponding to the fourth direction in a plan view.

7. The pixel of claim 3, wherein
the at least one (1-1) th electrode and the at least one (1-2) th electrode are electrically connected to each other in an alternating manner inalternately arranged along the second direction, and
the at least one (2-1) th electrode and the at least one (2-2) th electrode are electrically connected to each other in an alternating manner inalternately arranged along the second direction.

8. The pixel of claim 3, further comprising an insulating layer disposed over the light emitting elements,
wherein the insulating layer has a planar shape corresponding to the first and second electrodes.

9. The pixel of claim 8, further comprising:
a first contact electrode disposed on the insulating layer, the first contact electrode being electrically connected to the first electrode and each of the light emitting elements; and
a second contact electrode disposed to be spaced apart from the first contact electrode in the first direction, the second contact electrode being electrically connected to the second electrode and each of the light emitting elements.

10. The pixel of claim 9, wherein
the first contact electrode has a planar shape corresponding to the first electrode, and
the second contact electrode has a planar shape corresponding to the second electrode.

11. The pixel of claim 2, wherein a distancewidth between the first electrode and the second electrode in the first direction is constant along the second direction in a plan view.

12. The pixel of claim 11, wherein
a width of the at least one (1-1) th electrode in the first direction and a width of the at least one (1-2) th electrode in the first direction are equal to each other, and
a width of the at least one (1-2) th electrode in the first direction and a width of the at least one (2-2) th electrode in the first direction are equal to each other.

13. The pixel of claim 12, wherein
each of the light emitting elements includes a first end portion and a second end portion, which are located at ends of each of the light emitting elements in a length direction between the first electrode and the second electrode, and
the first end portion is located adjacent to one of the first and second electrodes, and
the second end portion is located adjacent to the other of the first and second electrodes.

14. The pixel of claim 13, wherein the light emitting elements include light emitting elements of which length direction is parallel to the third direction or the fourth direction.

15. The pixel of claim 2, wherein the first electrode and the second electrode have a zigzag shape in a plan view.

16. The pixel of claim 1, wherein
the first end of the one of the at least one (1-1) th electrode is in direct contact with the one of the at least one (1-2) th electrode, and
the second end of the one of the at least one (1-1) th electrode is in direct contact with the another one of the at least one (1-2) th electrode.

17. The pixel of claim 1, wherein
each of the at least one (1-2) th electrode is directly connected to a first contact electrode that is directly connected to a first end of one of the light emitting elements, and
each of the at least one (2-2) th electrode is directly connected to a second contact electrode that is directly connected to a second and opposite end of the one of the light emitting elements.

18. The pixel of claim 2, wherein A pixel comprising:
a first electrode and a second electrode that are spaced apart from each other in a first direction, the first electrode and the second electrode each extending in a second direction intersecting the first direction;
light emitting elements disposed between the first electrode and the second electrode;
a bank surrounding the light emitting elements along a periphery of the light emitting elements in a plan view, the bank including at least one opening, wherein
the first electrode includes:
at least one (1-1) th electrode extending in a third direction inclined with respect to one of the first and second directions; and
at least one (1-2) th electrode extending in a fourth direction intersecting the third direction,
the second electrode includes:
at least one (2-1) th electrode extending in the third direction; and
at least one (2-2) th electrode extending in the fourth direction,
the at least one (1-1) th electrode and the at least one (2-1) th electrode correspond to each other in the first direction,
the at least one (1-2) th electrode and the at least one (2-2) th electrode correspond to each other in the first direction,
the at least one opening corresponds to an emission area in which light is emitted in each of the light emitting elements,
the first electrode and the second electrode have a same planar shape in the emission area, and
the first electrode and the second electrode include at least one curve having a predetermined curvature in a plan view.

19. A display device comprising:
a substrate; and
a plurality of pixels provided on the substrate, wherein each of the pixels includes:
a pixel circuit layer disposed on the substrate, the pixel circuit layer including at least one transistor;
a first electrode and a second electrode that are disposed on the pixel circuit layer and are spaced apart from each other in a first direction, the first electrode and the second electrode each extending in a second direction intersecting the first direction;
light emitting elements disposed between the first electrode and the second electrode; and
an insulating layer disposed over the light emitting elements, the first electrode includes:
a plurality of (1-1) th electrodes extending in a third direction inclined with respect to one of the first and second directions; and
a plurality of (1-2) th electrodes extending in a fourth direction intersecting the third direction, the second electrode includes:
a plurality of (2-1) th electrodes extending in the third direction; and
a plurality of (2-2) th electrodes extending in the fourth direction,
ones of the plurality of (1-1) th electrodes and ones of the plurality of (2-1) th electrodes correspond to each other in the first direction, and
ones of the plurality of (1-2) th electrodes and ones of the plurality of (2-2) th electrodes correspond to each other in the first direction,
neighboring ones of the plurality of (1-1) th electrodes are electrically connected together by one of the plurality of (1-2) th electrodes, and
neighboring ones of the plurality of (2-1) th electrodes are electrically connected together by one of the plurality of (2-2) th electrodes.

20. The display device of claim 19, wherein
each of the plurality of (1-1) th electrode and each of the plurality of (2-1) th electrode have a same planar shape, and each of the plurality of (1-2) th electrode and each of the plurality of (2-2) th electrode have a same planar shape.

21. The display device of claim 20, wherein a width of each of the plurality of (1-1) th electrode, each of the plurality of (1-2) th electrode, each of the plurality of (2-1) th electrode, and each of the plurality of (2-2) th electrode in the second direction is smaller than a length of each of the light emitting elements.

22. The display device of claim 19, further comprising:
a bank surrounding the light emitting elements along a periphery of the light emitting elements in a plan view, the bank including at least one opening;

a first contact electrode electrically connected to the first electrode and each of the light emitting elements; and a second contact electrode disposed to be spaced apart from the first contact electrode in the first direction, the second contact electrode being electrically connected to the second electrode and each of the light emitting elements, wherein the at least one opening corresponds to an emission area in which light is emitted in each of the light emitting elements, and each of the insulating layer, the first contact electrode, and the second contact electrode has a planar shape corresponding to the first and second electrodes in the emission area.

23. The display device of claim 19, wherein the plurality of (1-1) th electrodes and the plurality of (1-2) th electrodes are electrically connected to each other in an alternating manner in the second direction, and the plurality of (2-1) th electrodes and the plurality of (2-2) th electrodes are electrically connected to each other in an alternating manner in the second direction.

\* \* \* \* \*